United States Patent
Ludwig

(10) Patent No.: US 8,671,370 B2
(45) Date of Patent: Mar. 11, 2014

(54) CHAIN/LEAPFROG CIRCUIT TOPOLOGIES AND TOOLS FOR CARBON NANOTUBE/GRAPHENE NANORIBBON NANOELECTRONICS, PRINTED ELECTRONICS, POLYMER ELECTRONICS, AND THEIR CONFLUENCES

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 431 days.

(21) Appl. No.: 12/791,040

(22) Filed: Jun. 1, 2010

(65) Prior Publication Data
US 2010/0306726 A1 Dec. 2, 2010

Related U.S. Application Data

(60) Provisional application No. 61/217,535, filed on Jun. 1, 2009, provisional application No. 61/348,366, filed on May 26, 2010.

(51) Int. Cl.
*G06F 17/50* (2006.01)

(52) U.S. Cl.
USPC ............ 716/100; 716/110; 716/119; 716/122

(58) Field of Classification Search
USPC .............. 703/13–14; 716/100, 106, 110, 119, 716/122, 139
See application file for complete search history.

(56) References Cited

U.S. PATENT DOCUMENTS

| | | | | |
|---|---|---|---|---|
| 3,916,380 A * | 10/1975 | Fletcher et al. | ............... | 340/2.26 |
| 4,551,683 A * | 11/1985 | Matsuo et al. | ................. | 327/554 |
| 5,311,088 A * | 5/1994 | Nelson | ........................... | 327/552 |
| 5,428,188 A | 6/1995 | Dozier | | |
| 6,180,978 B1 | 1/2001 | Chatterjee et al. | | |
| 7,196,574 B1 * | 3/2007 | Vishinsky | ..................... | 327/557 |
| 7,838,809 B2 | 11/2010 | Ludwig | | |
| 7,858,918 B2 | 12/2010 | Ludwig | | |
| 2002/0053897 A1 | 5/2002 | Kajiwara et al. | | |
| 2005/0002448 A1 * | 1/2005 | Knight et al. | .................. | 375/219 |
| 2005/0076316 A1 * | 4/2005 | Pierrat et al. | ...................... | 716/4 |
| 2006/0119392 A1 | 6/2006 | Nozoe et al. | | |
| 2006/0236271 A1 * | 10/2006 | Zach | ................................ | 716/1 |
| 2007/0018692 A1 | 1/2007 | Chang | | |
| 2007/0237273 A1 * | 10/2007 | Tan et al. | ....................... | 375/350 |

(Continued)

OTHER PUBLICATIONS

Z. Chen et al. "An Integrated Logic Circuit Assembled on a Single Carbon Nanotube" Science, No. 5768, Vol. 311, Mar. 24, 2006, p. 1735.

(Continued)

*Primary Examiner* — Paul Dinh

(57) ABSTRACT

Software for designing and testing types of nanoelectronic circuits and larger scale electronics renderings is described. The software designs circuits comprising only a chain/leapfrog topology. The chain/leapfrog topology permits a wide range of circuits and circuit modules to be implemented on a common shared carbon nanotube, graphene nanoribbon, or strips of other types of semiconducting material, for example as rendered in traditional printed electronics and nanoscale printed electronics or as employing semiconducting polymers. In one approach a chain/leapfrog topology circuit design software tool accesses information in a library of chain/leapfrog circuits data, and creates descriptive data pertaining to a number of approaches to rendering electronics components using a library of component data. The chain/leapfrog circuits data library includes designs for a number of different types of chain/leapfrog circuit modules. The software provides for "IP cores," "System-on-a-Nanotube," and other related modular design approaches.

23 Claims, 40 Drawing Sheets

(56) References Cited

U.S. PATENT DOCUMENTS

| | | |
|---|---|---|
| 2008/0051051 A1* | 2/2008 | Kral .............................. 455/264 |
| 2009/0101940 A1 | 4/2009 | Barrows et al. |
| 2009/0212342 A1 | 8/2009 | Roizin et al. |
| 2009/0313595 A1 | 12/2009 | Moroz et al. |
| 2010/0250187 A1 | 9/2010 | Zuber et al. |
| 2011/0062313 A1 | 3/2011 | Ludwig |
| 2011/0062418 A1 | 3/2011 | Ludwig |
| 2011/0092030 A1 | 4/2011 | Or-Bach et al. |

OTHER PUBLICATIONS

Michael A. Riepe, Karem A. Sakallah, "Transistor placement for noncomplementary digital VLSI cell synthesis" ACM Transactions on Design Automation of Electronic Systems (TODAES), vol. 8 Issue 1, Jan. 2003.

Li Ding, Mazumder, P., "On optimal tapering of FET chains in high-speed CMOS circuits," IEEE Transactions on Circuits and Systems II: Analog and Digital Signal Processing, vol. 48 Issue: 12, Dec. 2001, pp. 1099-1109.

Bourguet Vincent, De Lamarre Laurent, Rosset-Louërat Marie-Minerve, "Analog IC Design with a Library of Parameterized Device Generators," 19th International Conference on Design of Circuits and Integrated Systems (DCIS'2004), Bordeaux, France, Nov. 2004, pp. 739-744.

Gielen, G.G.E.; Rutenbar, R.A., "Computer-aided design of analog and mixed-signal integrated circuits," Proceedings of the IEEE, vol. 88 Issue 12, Dec. 2000, pp. 1825-1854.

Bengt NordÉn, Eva Krutmeijer, "The Nobel Prize in Chemistry, 2000: Conductive polymers,"The Royal Swedish Academy of Sciences, Stockholm, Sweden, 2000.

Fix, W., Ullmann, A., Blache, R. and Schmidt, K. "Organic Transistors as a Basis for Printed Electronics," in Organic Electronics: Structural and Electronic Properties of OFETs (ed C. Wöll), Wiley-VCH Verlag GmbH & Co. KGaA, Weinheim, Germany. (2009).ch1.

ObservatoryNANO, "ICT Sector Focus Report: Printed Electronics," Apr. 2010.

Office Action in U.S. Appl. No. 13/114,833 issued Oct. 5, 2012, 6 pages.

* cited by examiner

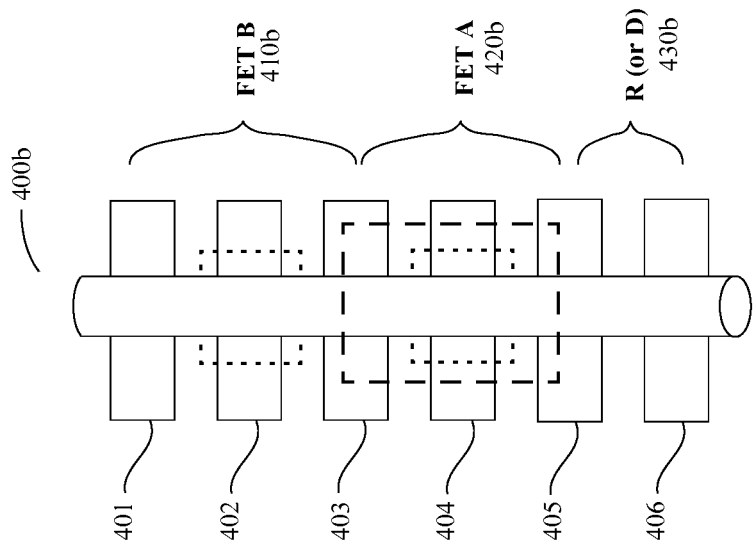
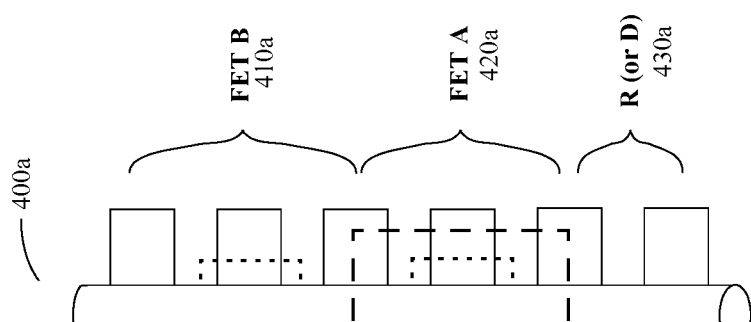
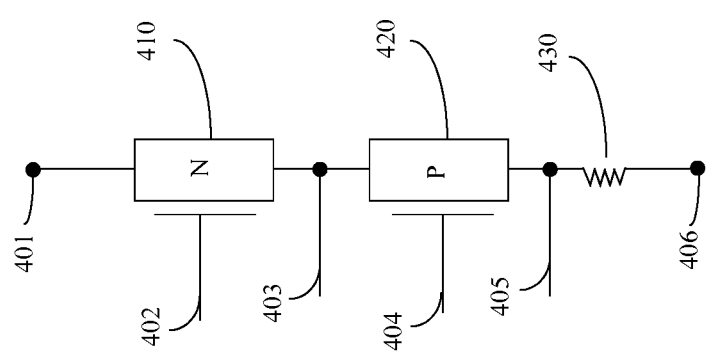
Figure 4c
Figure 4b
Figure 4a

CHAIN/LEAPFROG CIRCUIT TOPOLOGIES AND TOOLS FOR CARBON NANOTUBE/GRAPHENE NANORIBBON NANOELECTRONICS, PRINTED ELECTRONICS, POLYMER ELECTRONICS, AND THEIR CONFLUENCES

CROSS-REFERENCE TO RELATED APPLICATIONS

This application claims benefit of priority of U.S. provisional application Ser. No. 61/217,535 filed on Jun. 1, 2009, incorporated herein by reference. This application is also related to U.S. patent applications U.S. Ser. No. 12/025,562 with a priority date of Feb. 5, 2007, U.S. Ser. No. 12/033,212 with a priority date of Feb. 17, 2007, and U.S. 61/348,366 with a priority date of May 26, 2010.

BACKGROUND OF THE INVENTION

1. Field of the Invention

The present invention generally relates to nanotechnology, nanoelectronics, semiconducting polymer electronics, and to printed electronics at the nanometer, micrometer, and millimeter scale, and in particular, to circuits created from carbon nanotubes, graphene nanoribbons, strips of semiconducting polymers, and semiconducting inks used in printed electronics.

2. Background of the Invention

Even in isolation, nanoelectronics is an area of great unrealized commercial promise. This is driven by a number of factors, including the needs for every greater circuit densities and every-greater operating speeds. Additionally, there is at least one other important driver in that nanoelectronics will eventually be required for interfacing with various types of other nanosystem elements such as nanoscale sensors and actuators.

In particular within the area of nanoelectronics, active electronic semiconducting components realized with carbon nanotubes or graphene nanoribbons have attracted attention. Both carbon nanotubes and graphene nanoribbons are nanoscale forms of carbon, and some earlier taxonomies regard nanotubes as a type of graphene. More recently these materials, both allotropes of carbon, have come to be collectively referred to as "nanocarbon." In 2008 Andre Geim and team proved graphene sheets represent the fastest known semiconducting material, with a mobility greater than 200,000 cm2/Vs at room temperature (more than 100 times greater than the mobility of silicon, at least 30 times greater than the mobility of gallium-arsenide, and greater than the mobility of carbon nanotubes), P-type and N-type field-effect transistors have been demonstrated both theoretically and experimentally using carbon nanotubes, with additional noteworthy developments in carbon nanotube-based junction transistors, tunneling transistors, ballistic/near-ballistic field-effect transistors, single-electron transistors, field emission nanotriodes, resistors, diodes, light-emitting devices, photo-responsive devices, etc. Citations for these may be found in co-pending U.S. patent applications U.S. Ser. No. 12/025,562 and U.S. Ser. No. 12/033,212, and therein in particular provided discussions, citations, and teachings regarding carbon nanotube field effect transistors (CNFETs). Further, inspired by exciting research results for CNFET and startling discoveries regarding graphene sheets and ribbons, subsequent effort has been directed to creating graphene nanoribbon field effect transistors (GRFETs or GFETs) employing similar geometric electrode structures as employed in CNFETs.

Further, the area of printed electronics (i.e., the "printing" of interconnected circuit elements from various types of semiconducting, conducting, resistive, and insulating inks) has recently begun developing realistic printed electronics techniques at the nanometer scale in addition to traditional millimeter and micrometer scales (see for example, ObservatoryNano, *ICT Sector Focus Report: Printed Electronics*, April 2010, available at http://www.observatorynano.eu/project/filesystem/files/ObservatoryNanoFocusReport PrintedElectronics.pdf).

Despite these promising advancements, there are at least five problems holding back the development of systems comprising nanoelectronics for commercial applications:

The lack of viable analog capabilities for interfacing nanosensors and nanoactuators with "outside world" and nanosystem-internal digital nanoelectronics (for example, in the 2006 IBM nanotransistor ring oscillator reported in "An Integrated Logic Circuit Assembled on a Single Carbon Nanotube," Z. Chen et al., *Science*, Mar. 24, 2006, Vol 311, pp. 1735, the output signal from the nanotransistor ring oscillator suffered extensive signal level losses as it was brought into the larger-scale world by direct connection to a 50-ohm input of spectrum analyzer);

The nanocircuit component placement problem for moderate to large numbers of nanotransistors;

The nanocircuit internal interconnection problem for moderate to large numbers of nanotransistors;

The techniques for designing and layout of carbon nanotube circuits are typically not developed in such a way as to be extendable to other types of nanotransistors and molecular transistors;

Even low-level prototyping of carbon nanotube nanotransistor circuits is difficult and expensive.

Many aspects of these five problems are addressed in the present and by related co-pending patent applications U.S. Ser. No. 12/025,562 with priority date Feb. 5, 2007, U.S. Ser. No. 12/033,212 with priority date Feb. 17, 2007, and U.S. 61/348,366 with a priority date of May 26, 2010.

More specifically, in order to interface with the all-important "outside world" basic analog capabilities such as differential amplifiers, operational amplifiers, comparators, digital-to-analog converters are required. Similarly, in order to interface with proposed nanosystem-internal digital nanoelectronics, there is also similar need for basic analog capabilities such as differential amplifiers, operational amplifiers, comparators, digital-to-analog converters. Although field-emission nanotriode differential amplifiers comprising carbon nanotube emission elements have been modeled and demonstrated, these devices are larger in physical scale than companion nanoelectronic components, require complex fabrication, and appear difficult to integrate with other types of nanoelectronic components. The absence of basic compatible analog capabilities in nanoelectronics has been a key missing link in nanoelectronics and nanosystem technologies.

Additionally, there is an internal interconnection and a component placement problem for nanocircuits comprising moderate to large numbers of nanotransistors. In order to create non-repetitive systems of adequate complexity, tens to hundreds to thousands of nano-transistors must be individually placed and uniquely interconnected. To fabricate carbon nanotube or graphene ribbon nanocircuits comprising a moderate to large numbers of transistors, it would appear that large numbers of individual carbon nanotubes or electrically-isolated regions of graphene must be separately manipulated or somehow grown in proper locations, and somehow interconnected.

As mentioned, co-pending patent applications U.S. Ser. No. 12/025,562, U.S. Ser. No. 12/033,212, and U.S. 61/348,366 contribute to addressing each of these problems. Some of the aspects of these inventions include:

Exemplary techniques for creating entire essential multi-transistor analog transistor circuits (such as entire differential amplifiers and comparators) from a small portion of a single semiconducting nanoscale object (such as a carbon nanotube, graphene-ribbon, etc.) using contemporary high-resolution photolithography, metallization, and doping manufacturing used in the silicon industry;

Exemplary techniques for adapting a complete multi-transistor single carbon-nanotube/graphene-ribbon differential amplifier so that portions within it and/or other regions of the same nanotube/ribbon can be used to directly integrate a wide variety of sensors within the signal amplifier, improving sensitivity and high-frequency performance;

Exemplary fabrication can involve:
   creating one or more interconnection layers;
   draping or otherwise positioning a physically-linear-structure semiconducting material (nanotubes, ribbons, etc.) over a robust range of target electrodes;
   any differential doping (vi photolithographic resist, focused implantation, etc.) required to create any complementary transistor types.

However, there are additional problems of concern that provide barriers to commercialization of nanoelectronics.

One of these additional problems is that the techniques for designing and layout of carbon nanotube circuits are not extendable to other types of nanotransistors and molecular transistors. The specialized physics, models, and many of the above limitations appear to preclude much re-use of the models and techniques with other types of nanotransistors and molecular transistors, making R&D funding opportunities more rarefied and elite.

Another of these additional problems is that the aforementioned specialized physics, models, and many of the above limitations make it difficult for broader populations of circuit designers to conceive of meaningful circuits and systems they could design.

Yet another of these additional problems is that prototyping of nanoelectronic circuits in general can be very difficult, time consuming, and expensive. The specialized physics, models, and many of the above limitations tend to isolate numerical simulation models to a precious few specialists and specialized isolated software programs. Further, the aforementioned fabrications costs and design barriers make physical prototyping out of reach for even most of the privileged few of the precious few specialists with access to the aforementioned rarefied and elite R&D funding opportunities.

The present invention addresses these three additional problems with (1) methods and (2) software-based systems for executing on one or more computers. These methods and software-based systems leverage one or more of:

Use of field effect transistors that can be readily fabricated from placement of an insulated conductor proximate to the strip, tube, or ribbon of semiconducting material arranged to span the distance between two contacting electrodes;

Use of a class of circuit topologies ("chain/leapfrog") that is applicable to implementing multi-transistor circuits on elongated strips, tubes, or fibers of semiconducting material;

Use of additional circuit design approaches, methods, and/or arrangements for obtaining chain/leapfrog circuit topologies that terminate on either end in one of one or more types of power supply terminals;

Use of a chain/leapfrog circuits library comprising designs for a plurality of chain/leapfrog circuit modules; and Providing support for "IP cores," "System-on-a-nanotube," and other related modular design approaches as taught in co-pending U.S. patent applications U.S. Ser. No. 12/025,562 with a priority date of Feb. 5, 2007, U.S. Ser. No. 12/033,212 with a priority date of Feb. 17, 2007, and U.S. 61/348,366 with a priority date of May 26, 2010.

The invention provides for conducting, insulating, semiconducting, and other types of printed electronic "inks" to used in a chain/leapfrog printable electronics realization. The invention also provides for these inks to be chosen so as to match or nearly approximate aspects of the electrical behavior and operative device structures of a direct emulation target such as chain/leapfrog carbon nanotube electronics, chain/leapfrog graphene ribbon electronics, and nanoscale chain/leapfrog semiconducting polymers. The invention further provides for these inks and subordinate structures used in the extensions to printable electronics to serve as scaled-up physical prototypes that can be interpreted through computer software so as to compensate for scale and/or minor differences. Yet further, the invention provides for the inks and subordinate structures used in the extensions to printable electronics to be adapted and combined with printable or other substrate structures to serve as scaled-up physical prototypes that can be interpreted through computer software so as to numerical impose additional effects that cannot be directly emulated.

SUMMARY OF THE INVENTION

In an embodiment, the invention comprises a computer system for the design and/or prototyping of a plurality of types of nanoelectronic circuits and larger scale electronics renderings.

One embodiment of the invention utilizes circuits comprising only a chain/leapfrog topology. The chain/leapfrog topology permits a wide range of circuits and circuit modules to be implemented on a common shared carbon nanotube, graphene nanoribbon, or strip of other types of semiconducting material, for example as rendered in traditional printed electronics and nanoscale printed electronics or as employing semiconducting polymers.

Another embodiment of the invention comprises a chain/leapfrog topology circuit design tool that accesses information in a chain/leapfrog circuits data library and a component data library and creates descriptive data pertaining to a plurality of electronics component rendering approaches.

The chain/leapfrog circuits data library comprises designs for a plurality of chain/leapfrog circuit modules.

In an embodiment, the printed electronics component data library comprises component data for carbon nanotube electronics, graphene ribbon electronics, semiconducting polymer electronics, nanoscale semiconducting polymer electronics, traditional printed electronics, and nanoscale printed electronics In another embodiment, the invention comprises a chain-leapfrog simulation software tool.

In yet another embodiment, the invention further comprises a plurality of algorithmic mappings, each algorithmic mapping transforms a specified structure to a fabrication technique, associated materials, and associated processes relating to an associated electronics component rendering approach.

In yet another embodiment, the invention further comprises a plurality of transformations, wherein each transformation maps an aspect of a common high-level descriptor into terms pertaining to a particular electronics component rendering approach.

In an embodiment, the invention facilitates the use of traditional scale printed electronics as an emulation tool for chain/leapfrog topology nanoelectronics circuits.

In an embodiment, the invention supplements the use of traditional scale printed electronics as an emulation tool for chain/leapfrog topology nanoelectronics circuits with models providing mappings, transformations, simulations, and/or interpretations between the differences in the physics and electrical behavior of traditional scale printed electronics and the physics and electrical behavior of the nanoelectronic circuits.

BRIEF DESCRIPTION OF THE DRAWINGS

The above and other aspects, features, and advantages of the present invention will become more apparent upon consideration of the following description of preferred embodiments, taken in conjunction with the accompanying drawing figures.

FIG. 4a depicts an exemplary chain comprising an N-type FET, a P-type FET, and a resistor.

FIG. 4b shows an exemplary layout of electrodes, insulated gates over which a carbon nanotube is draped so as to form two carbon nanotube FETs, P-type oxygen barrier, and a carbon nanotube resistor.

FIG. 4c shows a related adaptation as can be used with a flat material such as a graphene ribbon or printed strip of semiconducting polymer, so as to form the N-type and P-types FETs and resistor.

FIG. 15b depicts an exemplary implementation of the current source circuit of FIG. 15a, arranged as a segment on the same carbon nanotube or flat strip of semiconducting material such as a graphene ribbon or printed strip of semiconducting polymer.

FIG. 16b illustrates an exemplary arrangement of extremal terminal interconnections of the eight transistors and current sources of the circuit of FIG. 16a.

DETAILED DESCRIPTION

Figure 1:
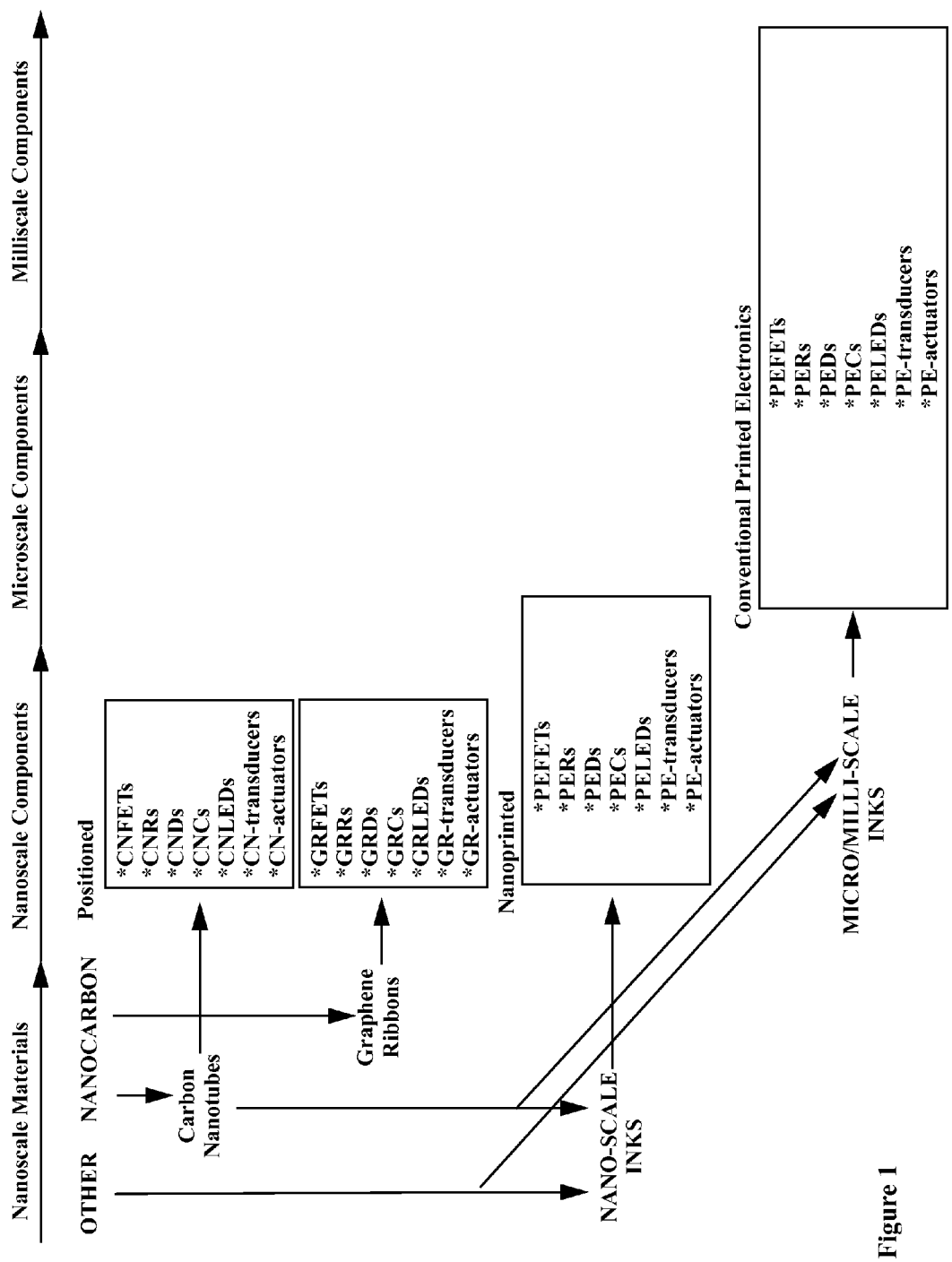
FIG. 1 provides an exemplary representation of various materials and components discussed in the context of the invention

In the following detailed description, reference is made to the accompanying drawing figures which form a part hereof, and which show by way of illustration specific embodiments of the invention. It is to be understood by those of ordinary skill in this technological field that other embodiments can be utilized, and structural, electrical, as well as procedural changes can be made without departing from the scope of the present invention. Wherever possible, the same element reference numbers will be used throughout the drawings to refer to the same or similar parts.

The present invention addresses these three additional problems with (1) methods and (2) software-based systems for executing on one or more computers. These methods and software-based systems leverage one or more of:

Use of field effect transistors that can be readily fabricated from placement of an insulated conductor proximate to the strip, tube, or ribbon of semiconducting material arranged to span the distance between two contacting electrodes;

Use of a class of circuit topologies ("chain/leapfrog") that is applicable to implementing multi-transistor circuits on elongated strips, tubes, or fibers of semiconducting material;

Use of additional circuit design approaches, methods, and/or arrangements for obtaining chain/leapfrog circuit topologies that terminate on either end in one of one or more types of power supply terminals;

Use of a chain/leapfrog circuits library comprising designs for a plurality of chain/leapfrog circuit modules; and Providing support for "IP cores," "System-on-a-nanotube," and other related modular design approaches as taught in co-pending U.S. patent applications U.S. Ser. No. 12/025,562 with a priority date of Feb. 5, 2007, U.S. Ser. No. 12/033,212 with a priority date of Feb. 17, 2007, and U.S. 61/348,366 with a priority date of May 26, 2010.

The invention provides for conducting, insulating, semiconducting, and other types of printed electronic "inks" to be used in a chain/leapfrog printable electronics realization. The invention also provides for these inks to be chosen so as to match or nearly approximate aspects of the electrical behavior and operative device structures of a direct emulation target such as chain/leapfrog carbon nanotube electronics, chain/leapfrog graphene ribbon electronics, and nanoscale chain/leapfrog semiconducting polymers. The invention further provides for these inks and subordinate structures used in the extensions to printable electronics to serve as scaled-up physical prototypes that can be interpreted through computer software so as to compensate for scale and/or minor differences. Yet further, the invention provides for the inks and subordinate structures used in the extensions to printable electronics to be adapted and combined with printable or other substrate structures to serve as scaled-up physical prototypes that can be interpreted through computer software so as to numerical impose additional effects that cannot be directly emulated.

In the specification to follow, first an overview of exemplary materials, components, and fabrication techniques relevant to the invention is provided. This is followed by an overview of exemplary chain-leapfrog circuit adaptations, circuit design, and circuit realization techniques, methods, and arrangements for modular implementations. Then additional considerations relevant to the invention for printed electronics are presented. This is followed by a series of techniques for leveraging selected classes of physical fabrication approaches to create universal design framework and software tools. Next a series of techniques and systems for Leveraging the universal design framework to employ printed electronics as a nanoelectronics emulation prototyping tool presented. Finally exemplary embodiments of overall design, simulation, and emulation methods and software tools are presented, followed by closing remarks pertaining to the invention.

Overview of Materials, Components, and Fabrication Techniques Relevant to the Invention In order to establish and maintain clarity in the subsequent discussion, FIG. 1 provides an exemplary representation of various materials, components, and fabrication techniques discussed in the context of the invention. Nanoscale materials relevant to the invention can include semiconducting "nanocarbon" allotropes of carbon (for example semiconducting carbon nanotubes and graphene nanoribbons) as well as other types of materials. Carbon nanotube research initially led the way with the creation of a number of nanoscale electrical components including:

Carbon nanotube field effect transistors, denoted CNFETs, and other types of "nanotransistors;"

Carbon nanotube nanoscale resistors ("nanoresistors"), denoted CNR;

Carbon nanotube nanoscale diodes ("nanodiodes"), denoted CND;

Carbon nanotube nanoscale capacitors ("nanocapacitors"), denoted CNC;

Carbon nanotube nanoscale LEDs;

Carbon nanotube nanoscale transducers (including sensors);

Carbon nanotube nanoscale actuators.

More recently, research on graphene-based electrical components has quickly progress, fueled by attractive properties such as graphene's magnificent carrier mobility (and impeded somewhat as undoped-intrinsic graphene has no indigenous band gap), leading to at least early work towards realizations of similar nanoscale electrical components such as:

Graphene nanoribbon field effect transistors, denoted GRFETs (also denoted GFETs) and other types of "nanotransistors;"

Graphene nanoribbon nanoscale resistors ("nanoresistors"), denoted GRRs;

Graphene nanoribbon nanoscale diodes ("nanodiodes"), denoted GRDs;

Graphene nanoribbon nanoscale capacitors ("nanocapacitors"), denoted GRCs;

Graphene nanoribbon nanoscale light emission structures;

Graphene nanoribbon nanoscale transducers (including sensors);

Graphene nanoribbon nanoscale actuators.

Each of the aforementioned carbon nanotube and graphene nanoribbon electrical components can be fabricated by positioning the carbon nanotube or graphene nanoribbon over an electrode array supplemented by various types of insulation layers, impurity (such as oxygen) barrier layers, etc. Such electrodes, insulation layers, barrier layers, etc., can be rendered with high resolution photolithography techniques as perfected in the silicon industry as well as other emerging techniques such as precision placement with dielectrophoresis, electrodeposition, DNA, self-organization chemistry, inkjet heads, etc.

In addition, both nanocarbon (particularly carbon nanotubes) and other materials can be incorporated into inks that can be used to create structures of a comparable (nanometer) or larger (micrometer, millimeter, or larger) scale through printed electronics techniques (see for example, ObservatoryNano, *ICT Sector Focus Report: Printed Electronics*, April 2010, http://observatorynano.eu/project/filesystem/files/ObservatoryNanoFocusReport PrintedElectronics.pdf). In FIG. 1, the various types of inks are separated into inks suitable for (the newly emerging area of) nanometer-scale printed electronics and inks suitable for conventional (micrometer, millimeter, or larger scale) printed electronics. These can be used to create a number of nanometer, micrometer, millimeter, or larger scale printed electrical components including:

Printed electronic field effect transistors, denoted PEFETs, as well as other types of printed electronic transistors;

Printed electronic resistors, denoted PER;

Printed electronic diodes, denoted PED;

Printed electronic capacitors, denoted PEC;

Printed electronic LEDs and light-emitting transistors;

Printed electronic transducers (including sensors);

Printed electronic actuators.

With this overview of materials, components, and fabrication techniques established, attention is next directed to chain-leapfrog circuit adaptations, circuit design, and circuit realization employing these materials, components, and fabrication techniques as well as others that can be suitably adapted in a similar fashion.

Figure 2:
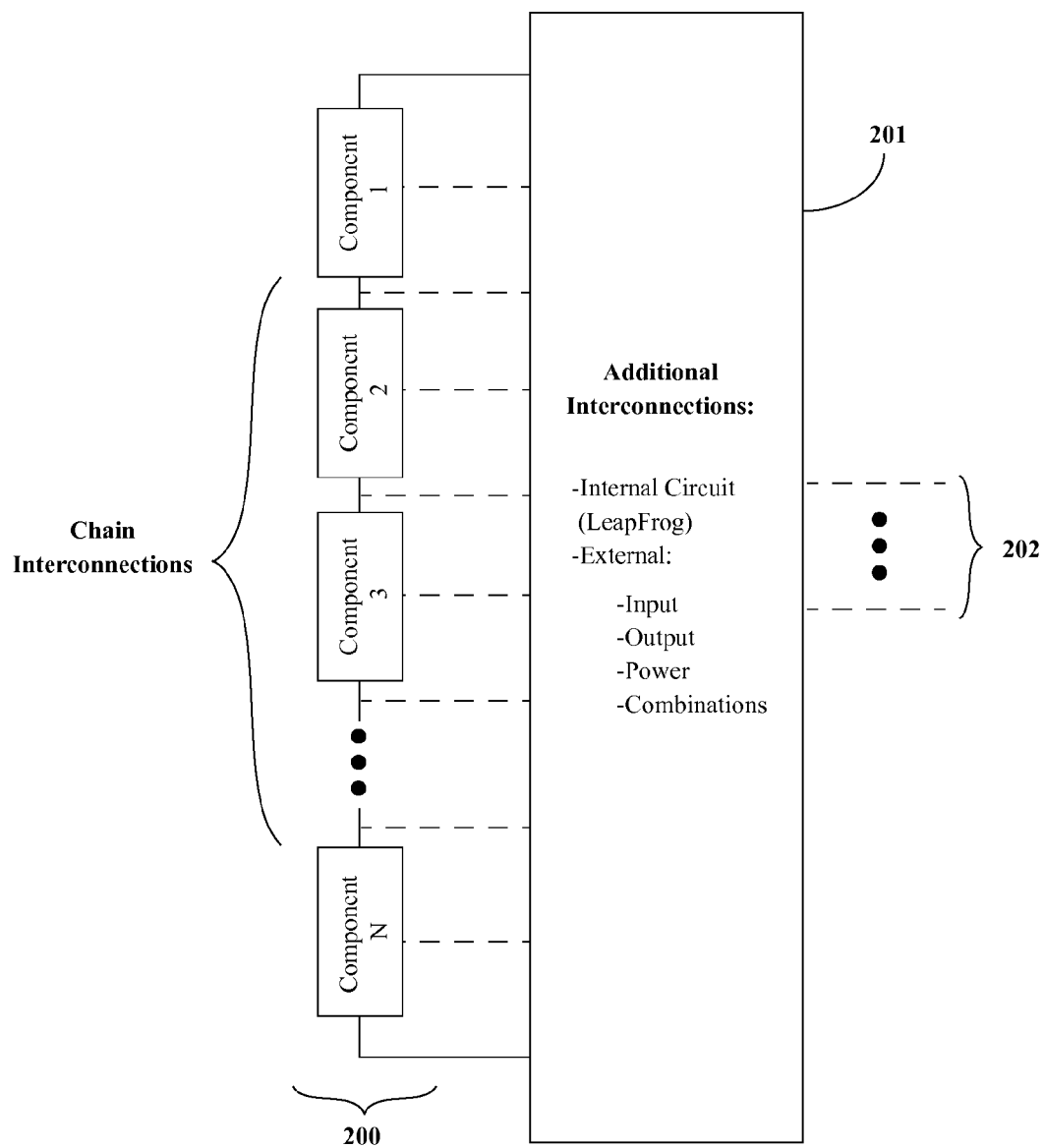
FIG. 2 depicts exemplary circuit topologies and structures pertaining to the invention.

Chain-Leapfrog Circuit Adaptations, Circuit Design, and Circuit Realization for Modular Implementation One aspect of the inventions of co-pending patent applications U.S. Ser. No. 12/025,562, U.S. Ser. No. 12/033,212, and U.S. 61/348,366 is the leveraging of circuit topologies that comprise a topological chain of consecutively electrically interconnected components. An example of this is shown in FIG. 2. In the figure, component 1, component 2, through component N can be two-terminal, three-terminal, or higher-terminal count devices. Component 1 and component 2 through component N are consecutively interconnected via extremal-positioned device terminals to form a chain 200. The beginning and ending of the chain, as well as potentially other selected terminals of the components, are also interconnected via interconnection conductors 201 with one or both of:

internally among themselves (with topological "leapfrog" paths);

externally 202 to one or more of:

circuit inputs;
circuit outputs;
circuit power;
combinations of two or more of these.

Exemplary circuit adaptations and circuit design techniques for such chain-leapfrog circuit topologies are taught in the aforementioned patent applications as well as in later discussions to follow.

Another aspect taught in co-pending patent application U.S. 61/348,366 are additional exemplary circuit adaptations and circuit design techniques for ensuring or forcing a specific linear chain to terminate on both terminating ends with a power supply terminal. For example:

1. both terminating ends of a chain can be $V_{SS}$;
2. both terminating ends of a chain can be $V_{DD}$;
3. one terminating end of a chain can be $V_{SS}$ and the other can be $V_{DD}$;
4. a combination of (3) and one or both of (1) and (2).

Figure 3A:
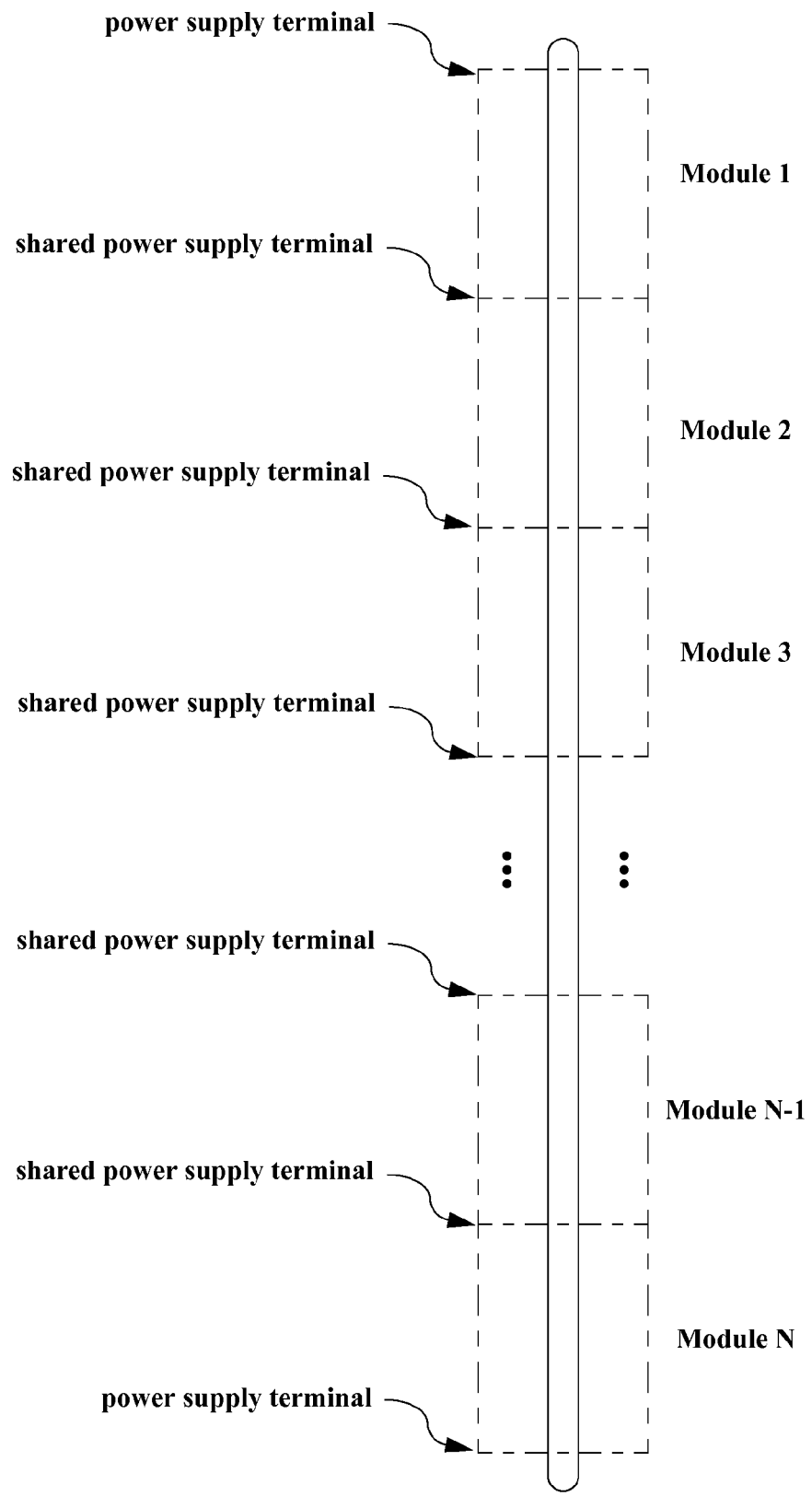
FIG. 3a depicts an exemplary representation of a family of exemplary approaches facilitating a chain of modules to share a common carbon nanotube, graphene ribbon, or other stripe or elongated semiconducting structure.

Such an approach facilitates a well-defined infrastructure for modular implementations of larger circuits and systems. FIG. 3a depicts an exemplary representation of this approach, facilitating a chain of modules (here Module 1 through Module N) to share a common carbon nanotube, graphene ribbon, or other strip or elongated semiconducting structure, and further examples will be provided in the discussion to follow.

Figure 3B:
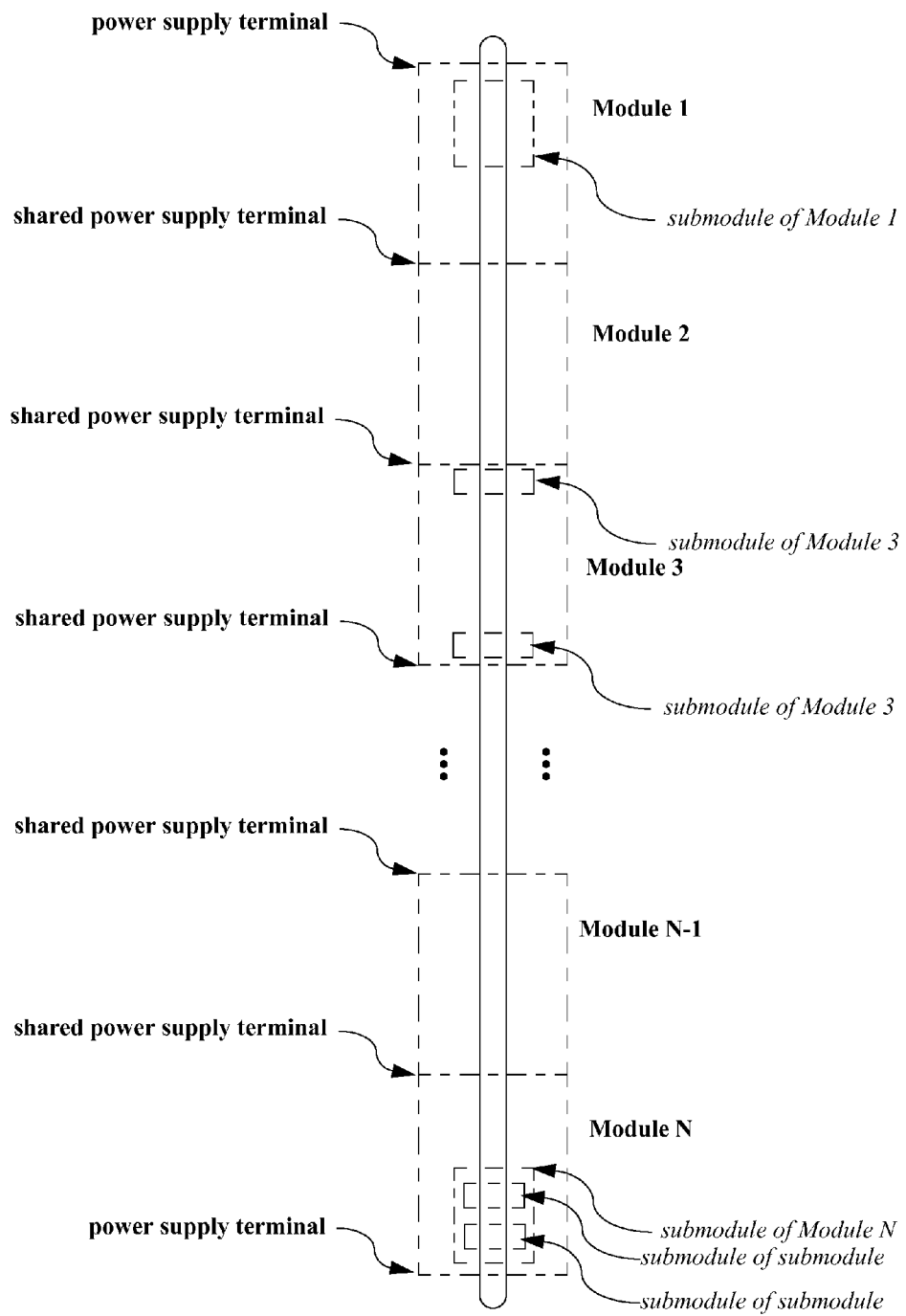
FIG. 3b depicts the exemplary arrangement of FIG. 3a wherein some of the exemplary modules internally comprise one or more submodules.

Another aspect taught in co-pending patent application U.S. 61/348,366 are submodular structures within modules. As an exemplary illustration, FIG. 3b depicts the exemplary arrangement of FIG. 3a wherein some of the exemplary modules internally comprise one or more exemplary submodules. For example, Module 1 of FIG. 3b is shown internally comprising a single exemplary submodule, Module 3 is shown internally comprising two exemplary submodules, and Module N is shown comprising a single exemplary submodule which in turn internally comprises two exemplary submodules. Examples of this include, for example Module 3 representing a differential amplifier internally comprising (for reasons to be described) two current source submodules, and Module N representing an operational amplifier comprising a differential-output differential amplifier internally comprising two current source submodules.

Attention is now directed more specifically to how such chain/leapfrog topologies can be designed and used to implement one or more circuits in a modular form on a common carbon nanotube, graphene ribbon, or other strip or elongated semiconducting structure.

As a very simple example, the circuit of FIG. 4a comprises an exemplary chain of an N-type carbon nanotube FET 410, a P-type carbon nanotube FET 420 and a carbon nanotube resistor 430. FIG. 4b shows a potential layout of electrodes 401-406 and insulated gates of the FETs over which a carbon nanotube 400a is draped (i.e., placed over underling structures 401-406) so as to form an N-type carbon nanotube FET 410a, a P-type carbon nanotube FET 420a and a carbon nanotube resistor 430a. Similarly, FIG. 4c shows a related adaptation as can be used with a flat material 400b such as a graphene ribbon or printed strip of semiconducting polymer, so as to form two FETs 410b, 420b and a resistor 430b. The depicted electrodes 401-406 can be used for internal and/or external connections.

Figure 5A:
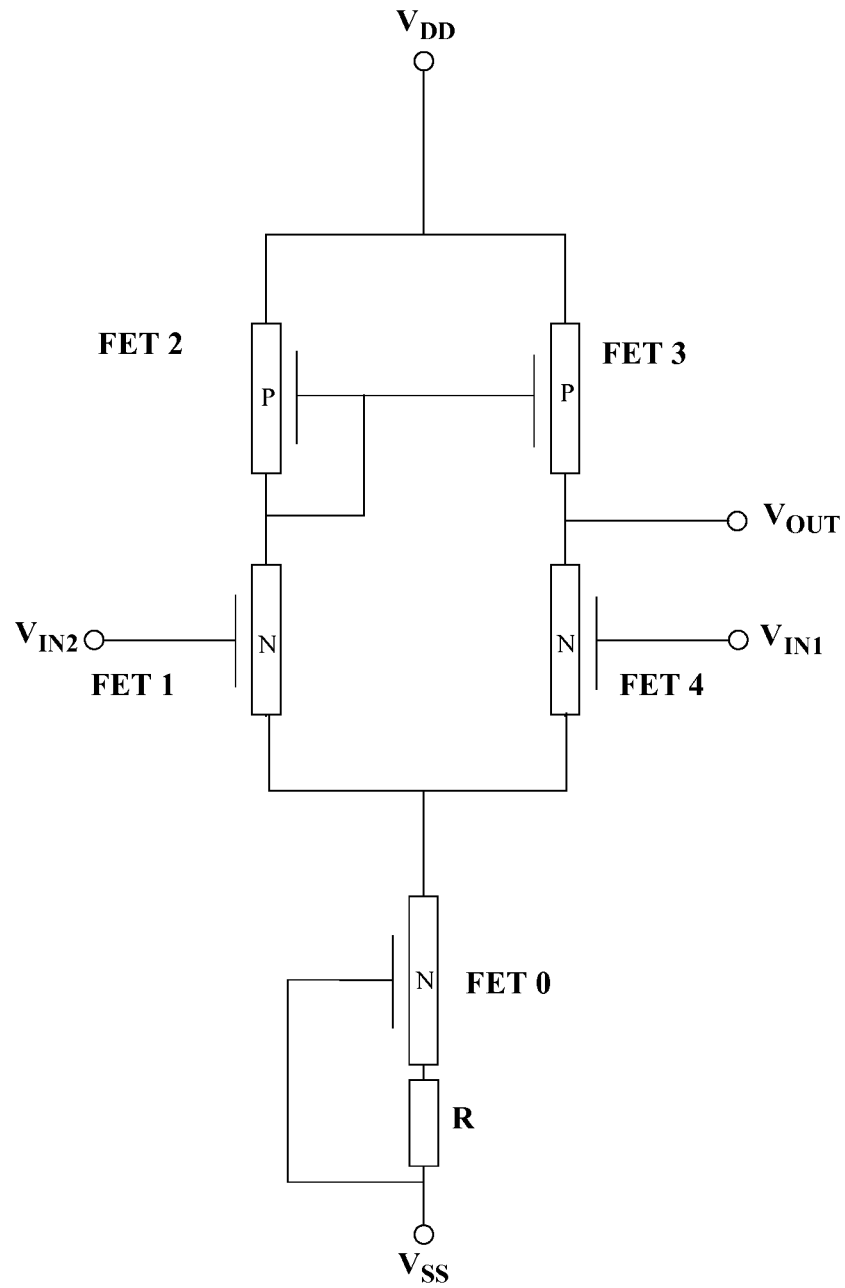
FIG. 5a shows a single-output differential amplifier comprising input FETs, active load FETs, and a current source arrangement comprising a FET and resistor.
Figure 5B:
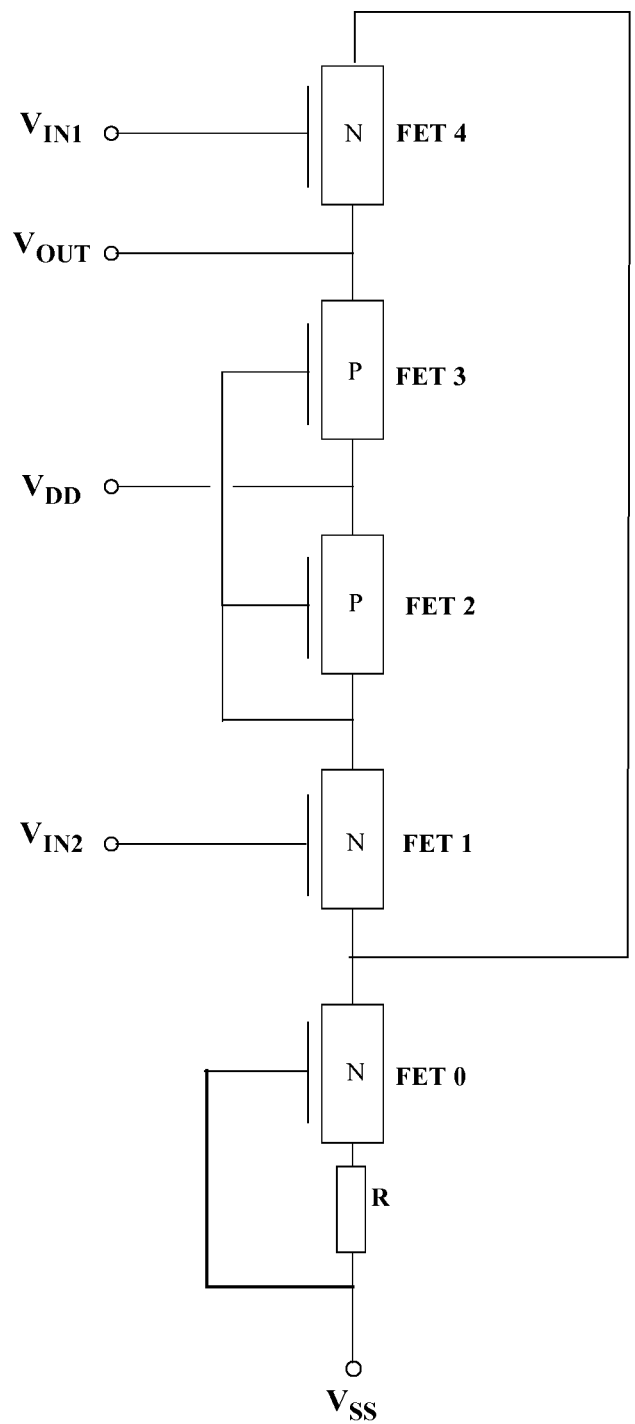
FIG. 5b depicts an exemplary redrawing of the electronic circuit of FIG. 5a redrawn in such way as to connect extremal terminals of each FET into a chain that includes the resistor.
Figure 5C:
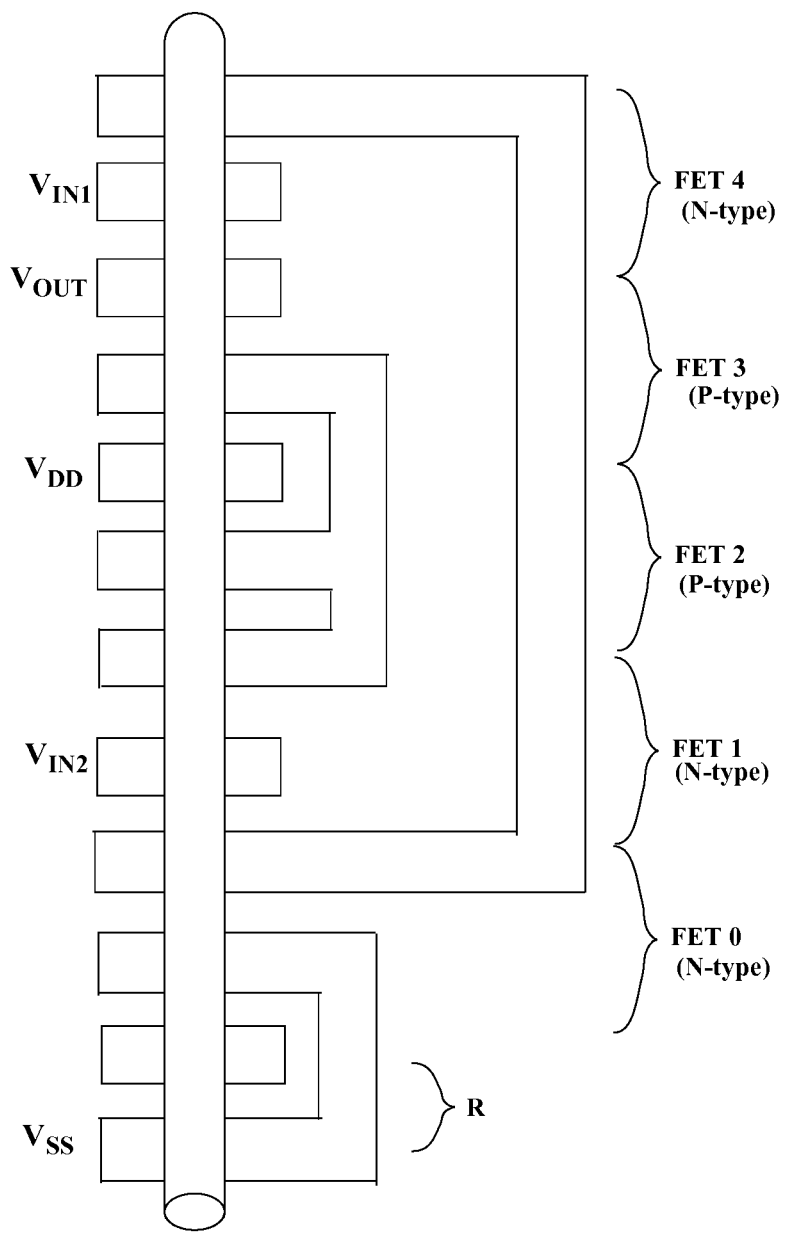
FIG. 5c depicts an exemplary electrode arrangement for a single carbon nanotube realization of the differential amplifier of FIG. 5a and its redrawing FIG. 5b.
Figure 5D:
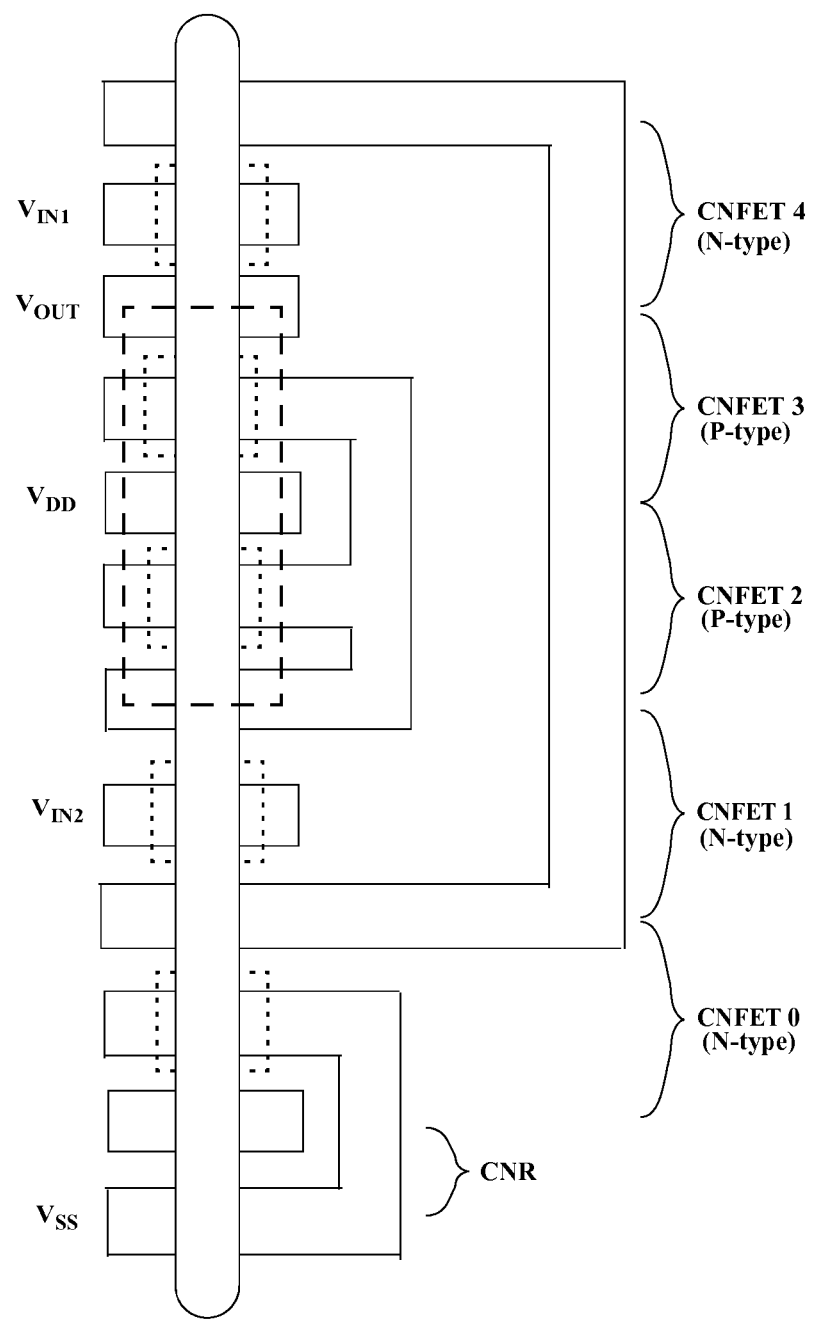
FIG. 5d depicts an exemplary layout of insulated gates and P-type regions (for example, as can be realized and sustained by a P-type oxygen barrier for a carbon nanotube.

As somewhat more complex example, FIG. 5a shows a single-output differential amplifier comprising input FET1 and FET 4, a current-mirror type active load arrangement comprising FET2 and FET 3, and a current source arrangement comprising a FET0 and a resistor. However, the electronic circuit of FIG. 5a can readily be redrawn in such way as to connect external terminals of the FETs as a chain that also includes the resistor as depicted in FIG. 5b. The input connections are made to the gates of FET1 and FET4 and the output connection is made to the junction between FET3 and FET 4. There are also a first internal ("leapfrog") interconnection linking the FET3 gate with the gate and drain/source terminal of FET 2, a second internal ("leapfrog") interconnection linking the gate of FET0 and the VSS power supply terminal at the far end of resistor, as well as a third internal ("leapfrog") interconnection linking FET0, FET 1, and FET4. As illustrated in FIG. 5c, this electrode arrangement permits the realization of the differential amplifier with a single common carbon nanotube, graphene ribbon, or other strip or elongated semiconducting structure. As an example, FIG. 5d shows how the arrangement of FIG. 5c can be adapted to a realization employing a single carbon nanotube. An insulating material between the gate electrodes and the carbon nanotube is used to create the CNFET gates; these are depicted as small dashed-line boxes. The two P-type FETs of FIGS. 5a-5c (FET2 and FET3) can be realized by oxygen extraction and sealing as taught in co-pending patent applications U.S. Ser. No. 12/025,562 and U.S. Ser. No. 12/033,212 and references cited therein; this is depicted as larger dashed-line box. The electrode configuration of FIG. 5c can also be used with a flat strip of semiconducting material such as a graphene ribbon or printed strip of semiconducting polymer. This will be discussed in more detail later. In these cases, FIG. 5d can be reinterpreted so that the small dashed-line boxes represent insulating layers between an underlying electrode and flat strip of semiconducting material, and so that the larger dashed-line box represents a region of P-type semiconducting material and portions of the flat strip of semiconducting material outside the larger dashed-line box represent regions of N-type semiconducting material.

Figure 6A:
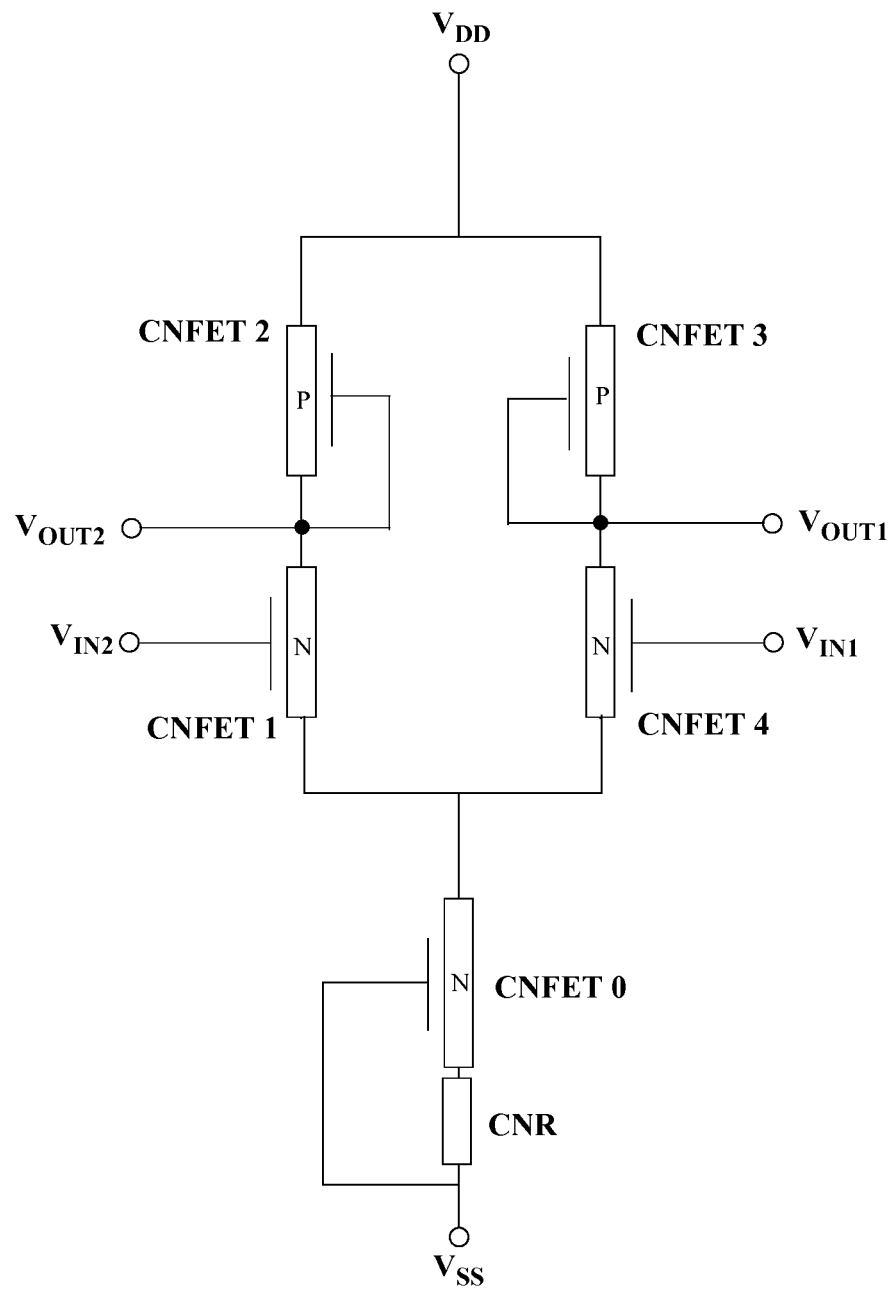
FIGS. 6a and 6b depict the outcomes of a similar development for a differential-output differential amplifier. The configuration of FIG. 6b can also be used with a flat strip of semiconducting material such as a graphene ribbon or printed strip of semiconducting polymer.
Figure 6B:
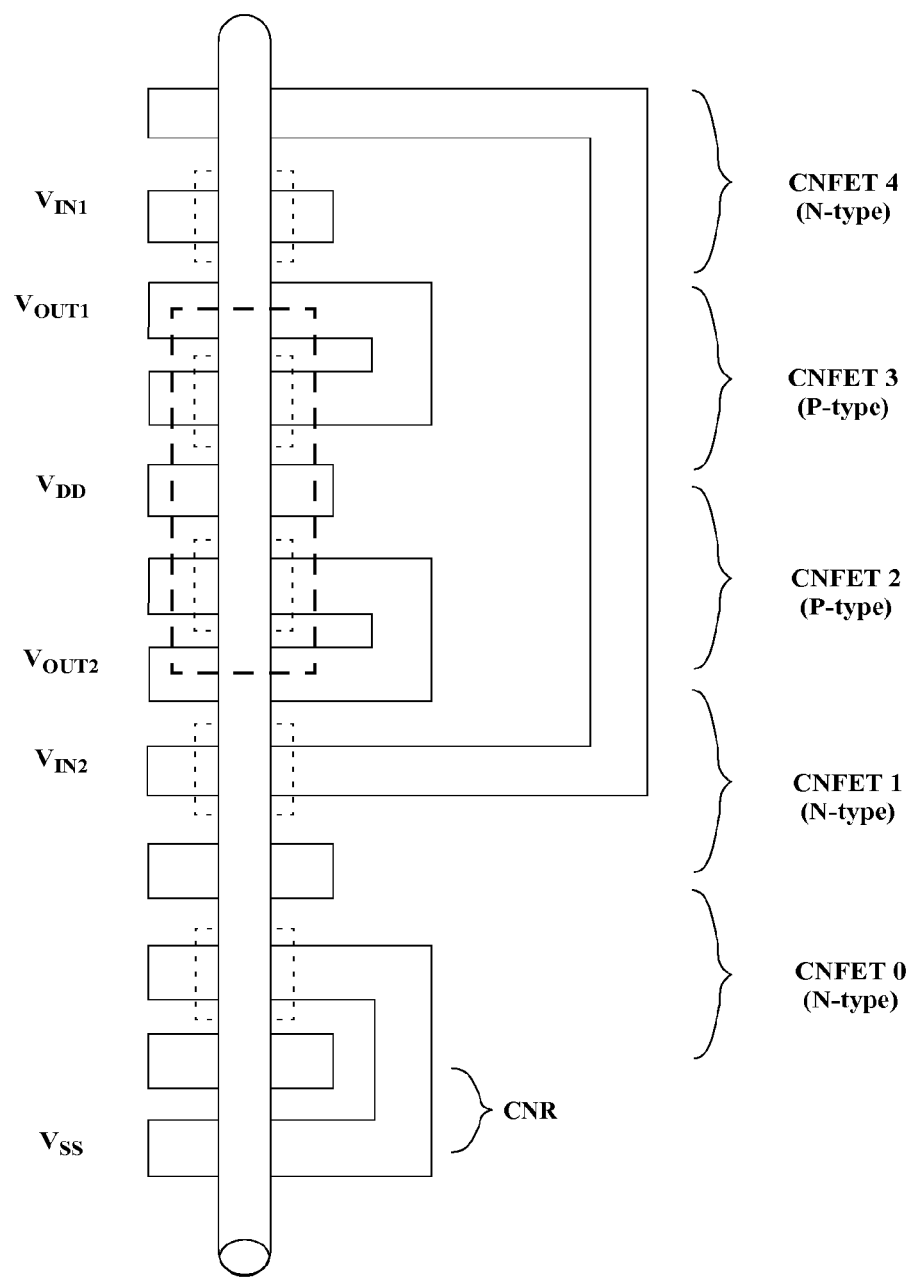

FIGS. 6a and 6b depict the outcomes of a similar development for a differential-output differential amplifier, with FIG. 6b provides an exemplary implementation of the circuit depicted in FIG. 6a on a portion of a carbon nanotube. The configuration of FIG. 6b can also be used with a flat strip of semiconducting material such as a graphene ribbon or printed strip of semiconducting polymer. This will be discussed in more detail later. In these cases, FIG. 6b can be reinterpreted so that the small dashed-line boxes represent insulating layers between an underlying electrode and flat strip of semiconducting material, and so that the larger dashed-line box represents a region of P-type semiconducting material and portions of the flat strip of semiconducting material outside the larger dashed-line box represent regions of N-type semiconducting material.

Figure 7A:
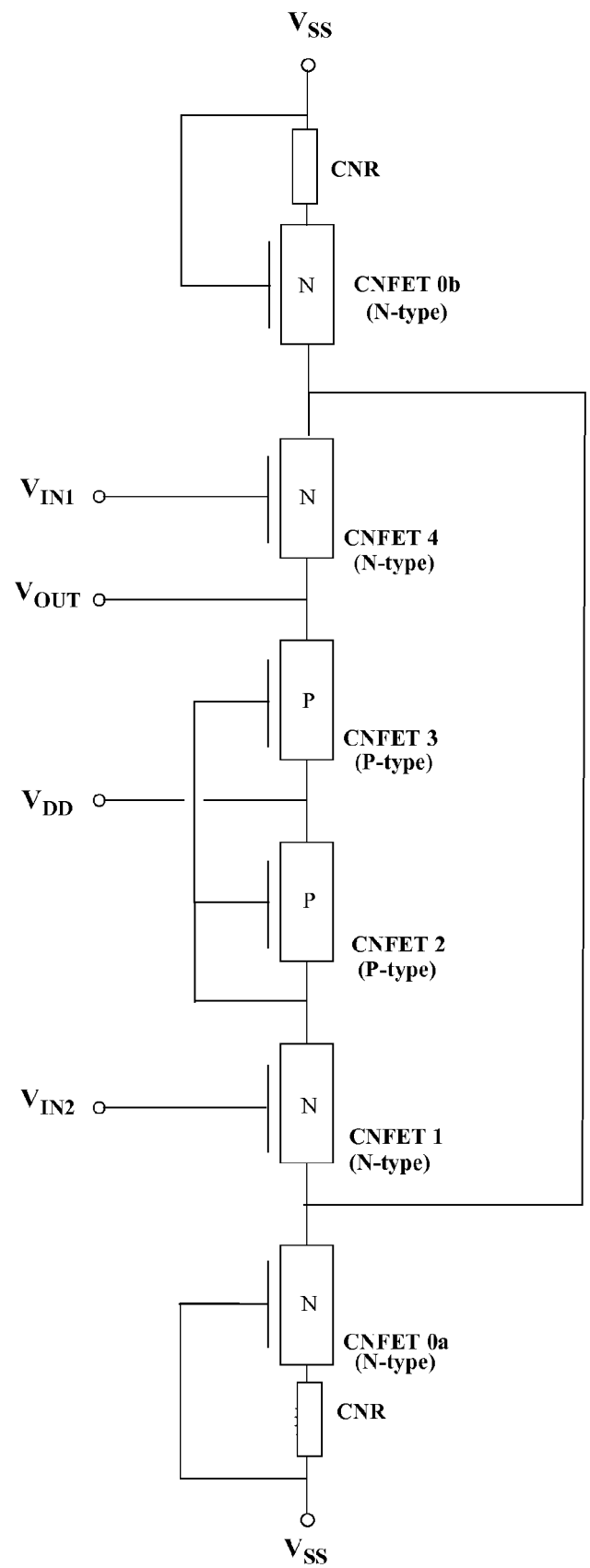
FIG. 7a depicts an exemplary adaptation of the arrangement of FIG. 5b wherein a second current source has been added so both ends of the chain are power supply terminals.
Figure 7B:
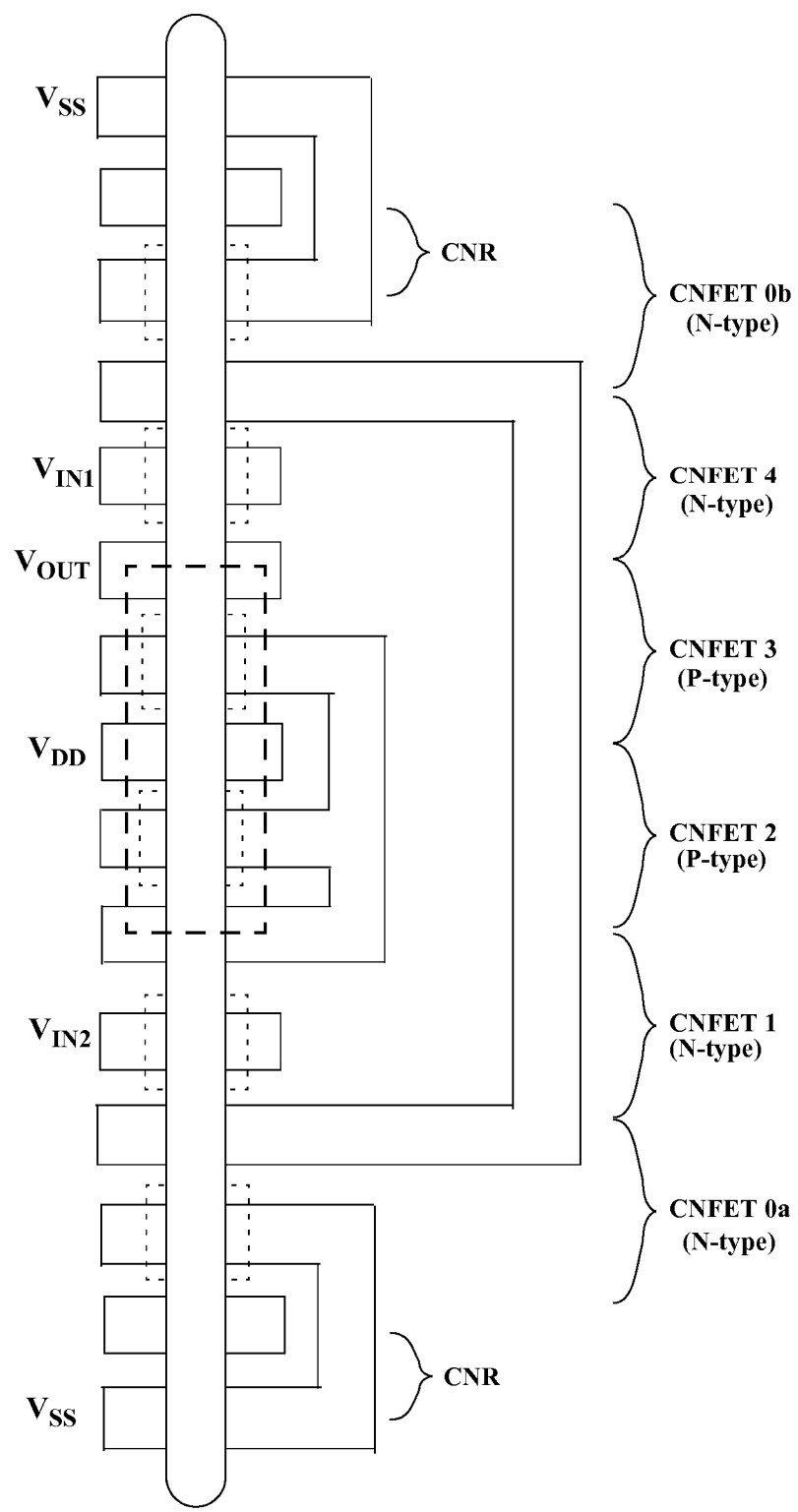
FIG. 7b provides an exemplary implementation of the circuit depicted in FIG. 7a on a portion of a carbon nanotube. The implementation of FIG. 7b can also be used with a flat strip of semiconducting material such as a graphene ribbon or printed strip of semiconducting polymer.

Another aspect taught in co-pending patent application U.S. 61/348,366 is the technique of adding a second current source to a differential amplifier circuit so as to create a configuration wherein each end of the chain is a power supply terminal. This provides an approach wherein a differential amplifier can be realized in a manner compliant with the modular approach depicted in FIGS. 3a and 3b. FIG. 7a depicts an exemplary adaptation of the arrangement of FIG. 5b wherein a second current source has been added. In terms of the circuit, the differential ladder portion of the differential amplifier of FIG. 7a is provided with twice the current as is the case in FIG. 5b. In some situations the resulting doubled current can be advantageous, in other situations the resulting doubled current could have little consequences, and in yet other situations component values or alternate current source types can be selected so that the current from the current source is approximately halved causing the doubled current of FIG. 7a to be approximately the same as it would otherwise be in the original FIG. 5b case. However, the important outcome is topological—the two ends of the chain of the circuit depicted in FIG. 7a are both power supply terminals, in keeping with the requirements depicted in FIGS. 3a and 3b. In this case, each of the power supply terminals depicted in FIGS. 3a and 3b are $V_{SS}$ power supply terminals. FIG. 7b provides an exemplary implementation of the circuit depicted in FIG. 7a on a portion of a carbon nanotube. The configuration of FIG. 7b can also be used with a flat strip of semiconducting material such as a graphene ribbon or printed strip of semiconducting polymer. This will be discussed in more detail later. In these cases, FIG. 7b can be reinterpreted so that the small dashed-line boxes represent insulating layers between an underlying electrode and flat strip of semiconducting material, and so that the larger dashed-line box represents a region of P-type semiconducting material and portions of the flat strip of semiconducting material outside the larger dashed-line box represent regions of N-type semiconducting material.

The second current source technique (for adapting or designing chain/leapfrog circuits so that both ends of the chain are power supply terminals) can also be applied to the differential-output differential amplifier considered earlier (in conjunction with FIGS. 6a and 6b), as well as for other types of differential amplifiers and other circuits. In this case, each of the power supply terminals depicted in FIGS. 3a and 3b are again $V_{SS}$ power supply terminals. Another example of the usefulness of the technique, but in an arrangement with alternating $V_{SS}$ and $V_{DD}$ power supply terminals, will be provided shortly.

Figure 8:
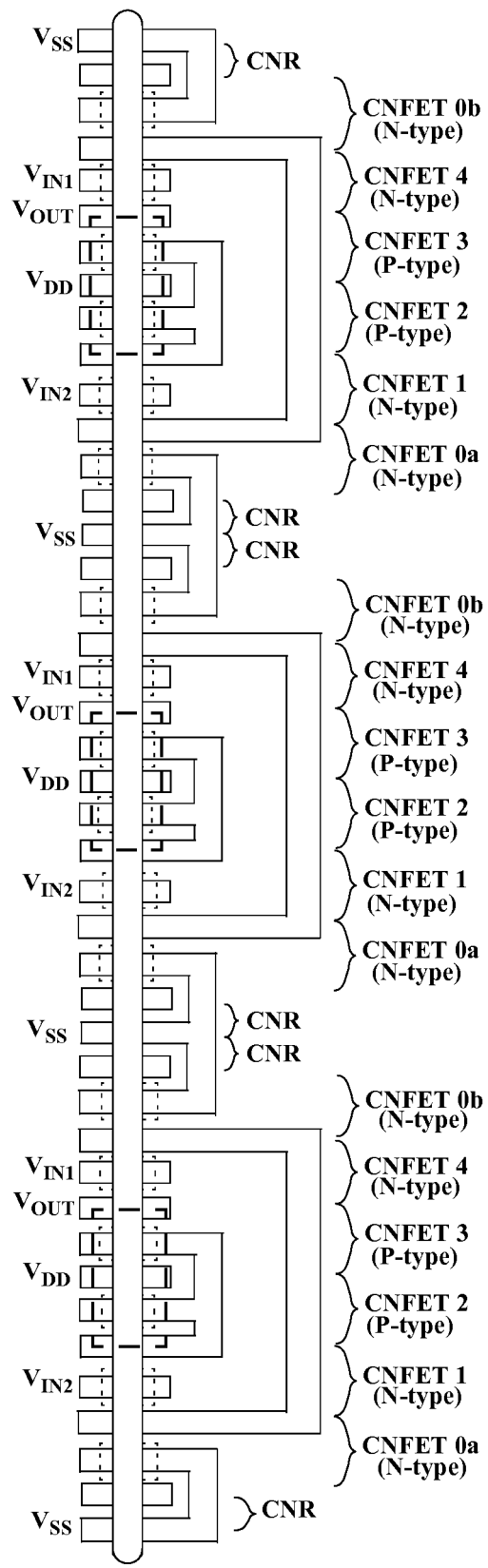
FIG. 8 depicts an exemplary arrangement comprising three exemplary CNFET differential amplifier modules pairwise-adjacently arranged on the same carbon nanotube. The arrangement can also be used with a flat strip of semiconducting material such as a graphene ribbon or printed strip of semiconducting polymer.

In keeping with the modular structure arrangements and requirements depicted in FIGS. 3a and 3b, FIG. 8 depicts an exemplary arrangement comprising three exemplary CNFET differential amplifier modules pairwise-adjacently arranged on the same carbon nanotube. FIG. 8 can be reinterpreted so that the small dashed-line boxes represent insulating layers between an underlying electrode and flat strip of semiconducting material, and so that the larger dashed-line box represents a region of P-type semiconducting material and portions of the flat strip of semiconducting material outside the larger dashed-line box represent regions of N-type semiconducting material.

Figure 9A:
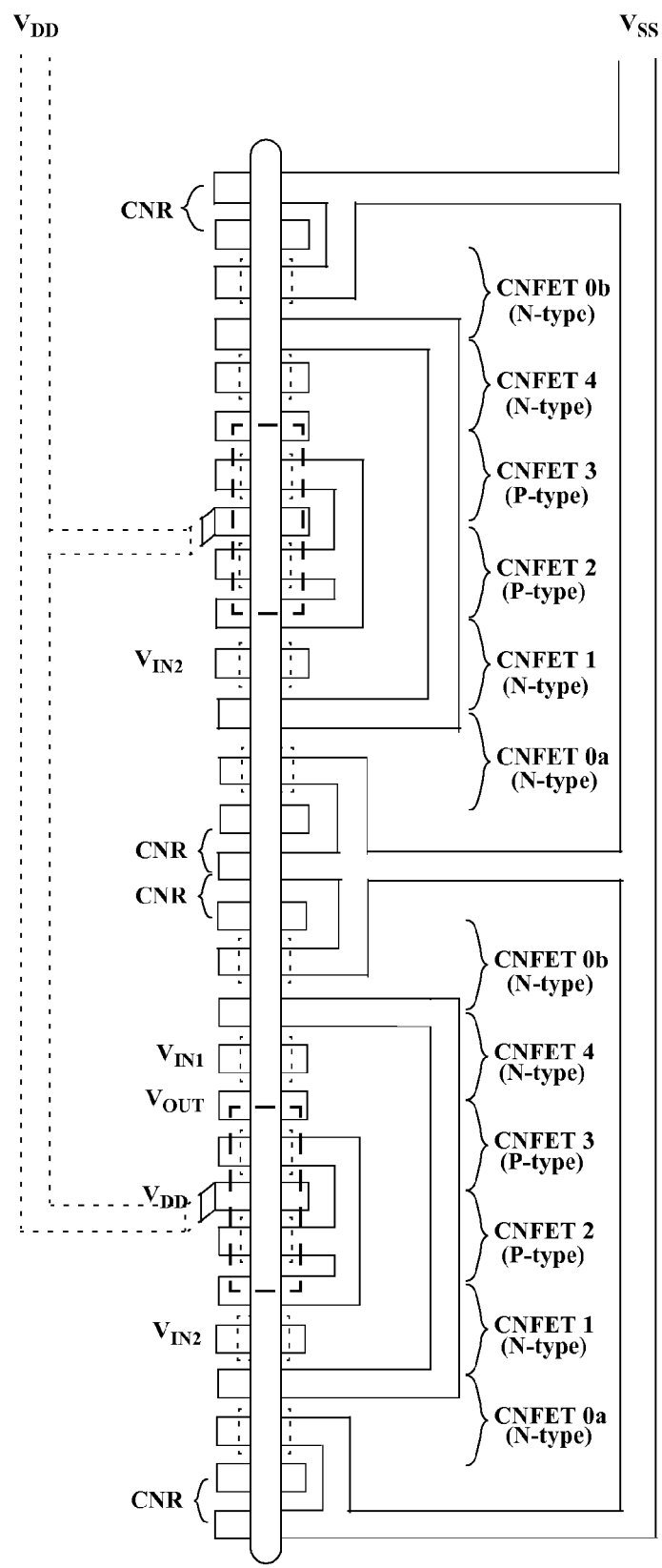
FIG. 9a depicts an exemplary arrangement of two exemplary CNFET differential amplifier modules pairwise-adjacently arranged on the same carbon nanotube where all the $V_{DD}$ power supply terminals are connected by an insulated power supply conductor positioned on the opposite side of the nanotube as the $V_{SS}$ power supply conductor.
Figure 9B:
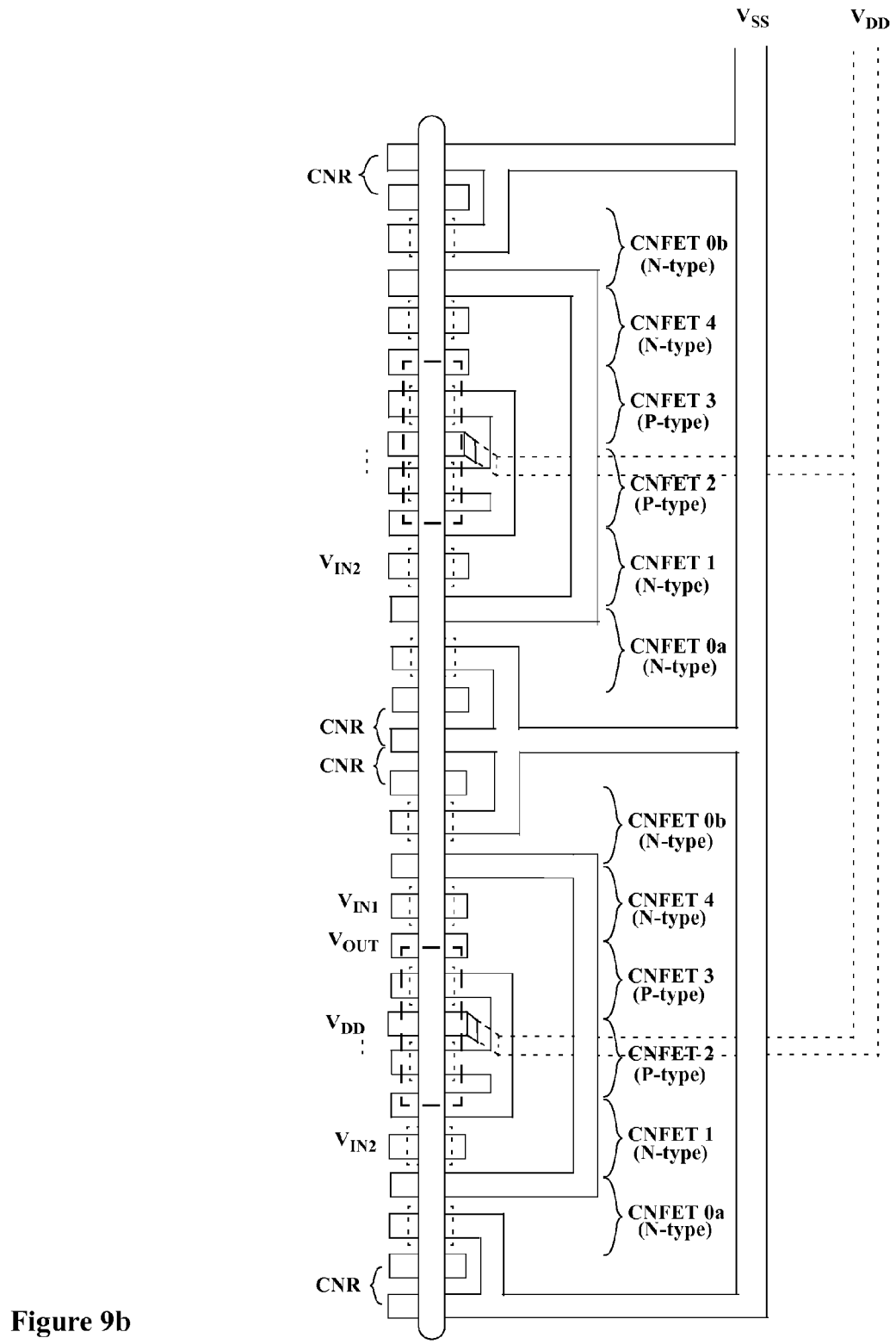
FIG. 9b depicts a variation of FIG. 9a wherein the insulated power supply conductor is on the same side of the nanotube as the $V_{SS}$ power supply conductor. These exemplary arrangements can also be used with a flat strip of semiconducting material such as a graphene ribbon or printed strip of semiconducting polymer.

Another aspect taught in co-pending patent application U.S. 61/348,366 is the use of power supply busses in conjunction with modular structure arrangements depicted in FIGS. 3a and 3b. Again in this case, each of the power supply terminals depicted in FIGS. 3a and 3b are $V_{SS}$ power supply terminals. FIG. 9a depicts an exemplary arrangement of two exemplary CNFET differential amplifier modules pairwise-adjacently arranged on the same carbon nanotube where all the $V_{DD}$ power supply terminals are connected by an insulated power supply conductor positioned on the opposite side of the nanotube as the $V_{SS}$ power supply conductor. FIG. 9b depicts a variation of FIG. 9a wherein the insulated power supply conductor is on the same side of the nanotube as the $V_{SS}$ power supply conductor. These exemplary arrangements can also be used with a flat strip of semiconducting material such as a graphene ribbon or printed strip of semiconducting polymer.

Figure 10:
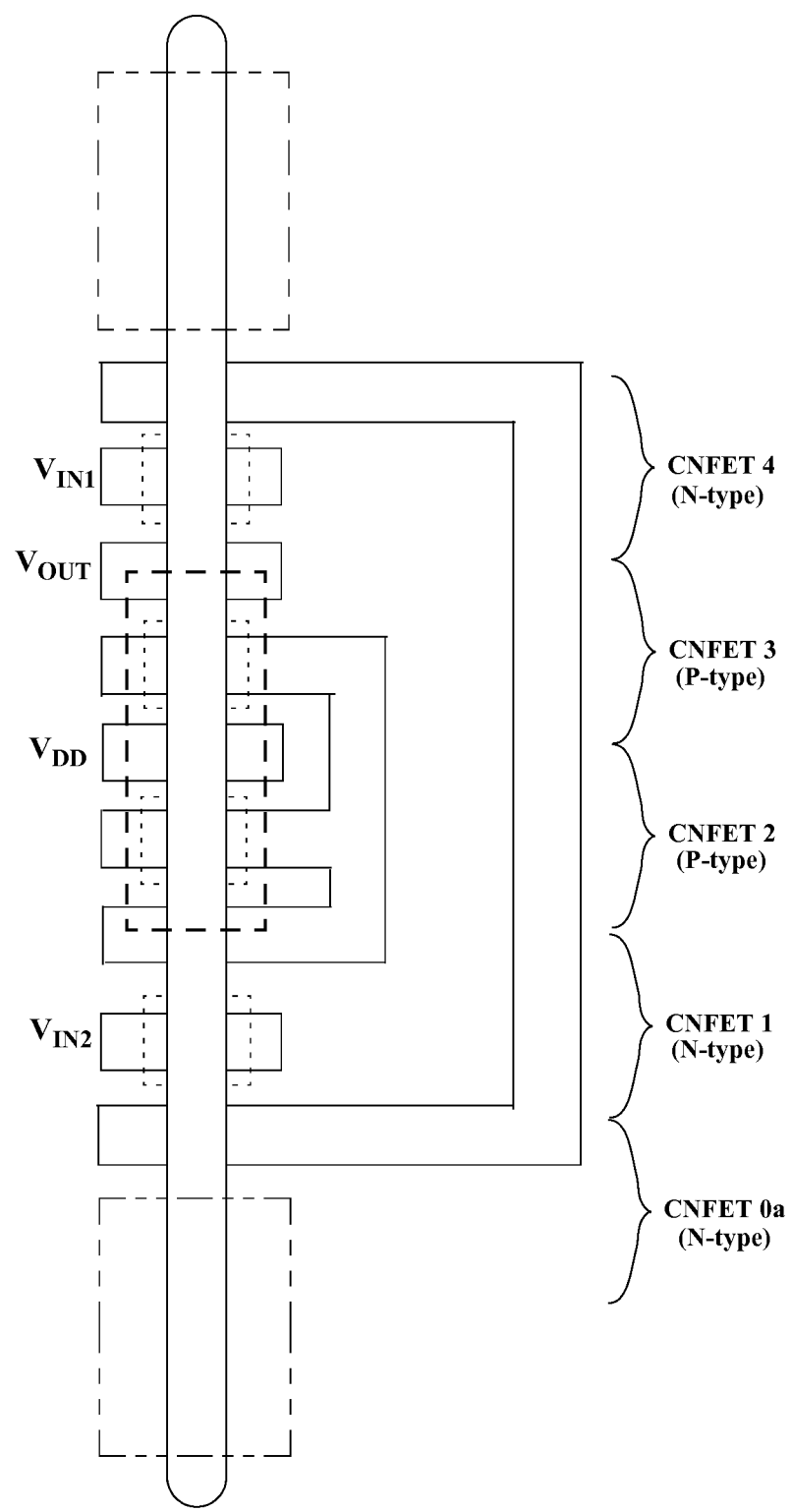
FIG. 10 depicts an exemplary configuration wherein an exemplary differential amplifier ladder module that is configured to be driven by two current sources is additionally arranged so as to interconnect with a pair of internally-unspecified current source submodules, one on either side of the exemplary differential amplifier ladder.
Figure 11B:
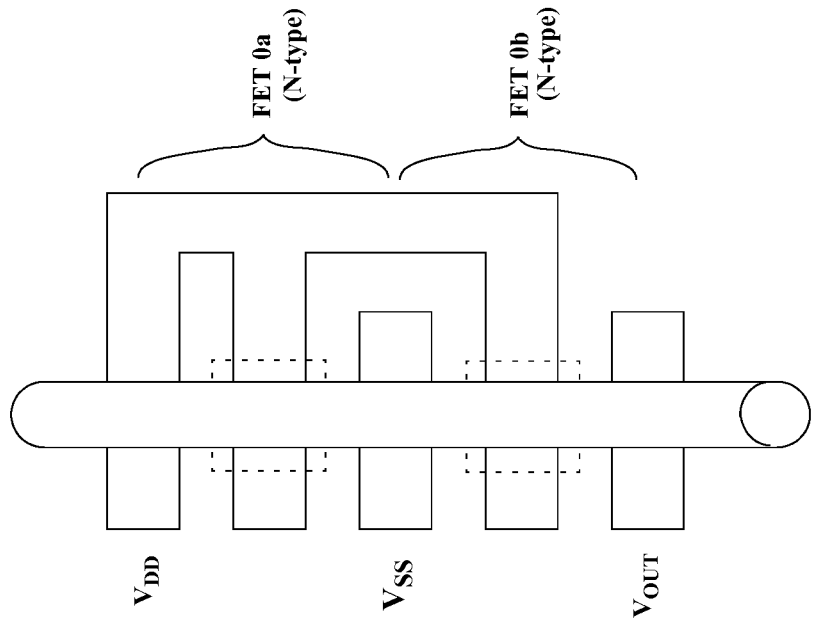
FIG. 11b depicts an exemplary implementation of the current source circuit of FIG. 11a, arranged as a segment on the same carbon nanotube or flat strip of semiconducting material such as a graphene ribbon or printed strip of semiconducting polymer.
Figure 11A:
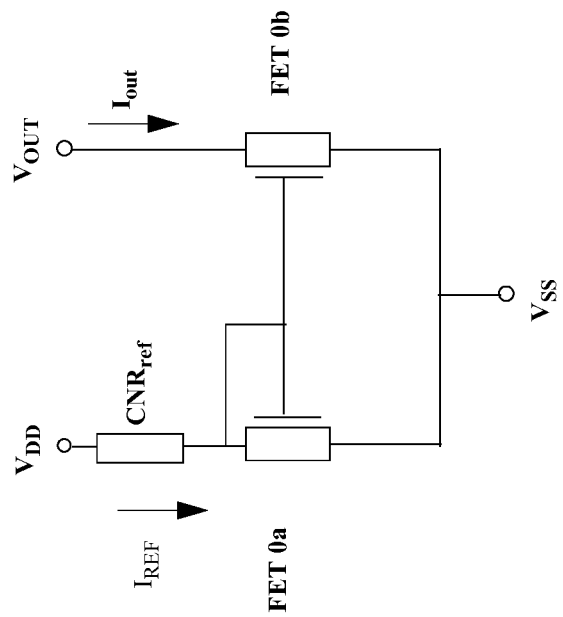
FIG. 11a depicts an exemplary simple current source employing a current mirror driven by a simple resistive current source.
Figure 12B:
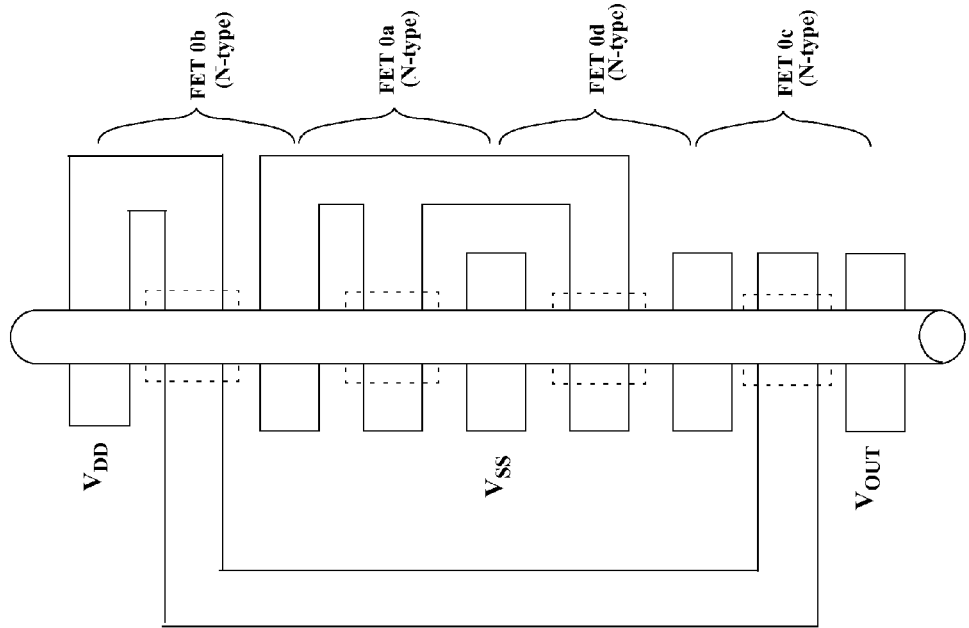
FIG. 12b depicts an exemplary implementation of the current source circuit of FIG. 12a, arranged as a segment on the same carbon nanotube or flat strip of semiconducting material such as a graphene ribbon or printed strip of semiconducting polymer.
Figure 12A:
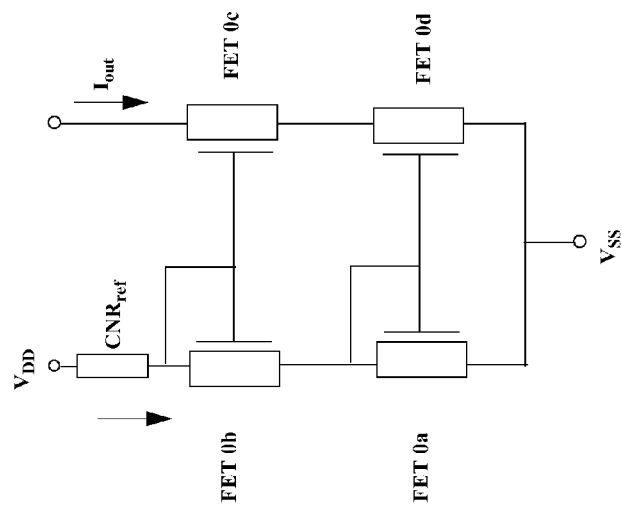
FIG. 12a depicts an exemplary cascode current source.
Figure 13B:
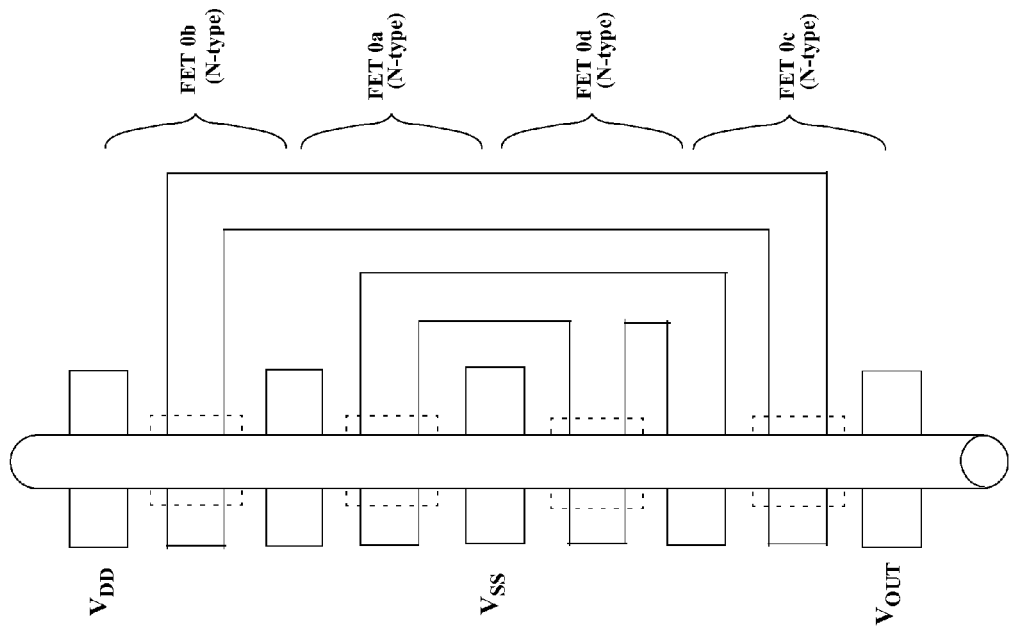
FIG. 13b depicts an exemplary implementation of the current source circuit of FIG. 13a, arranged as a segment on the same carbon nanotube or flat strip of semiconducting material such as a graphene ribbon or printed strip of semiconducting polymer.
Figure 13A:
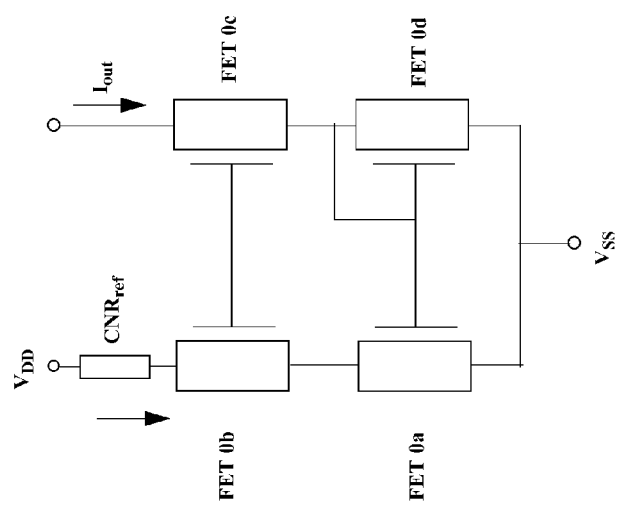
FIG. 13a depicts an exemplary Wilson current source.
Figure 14B:
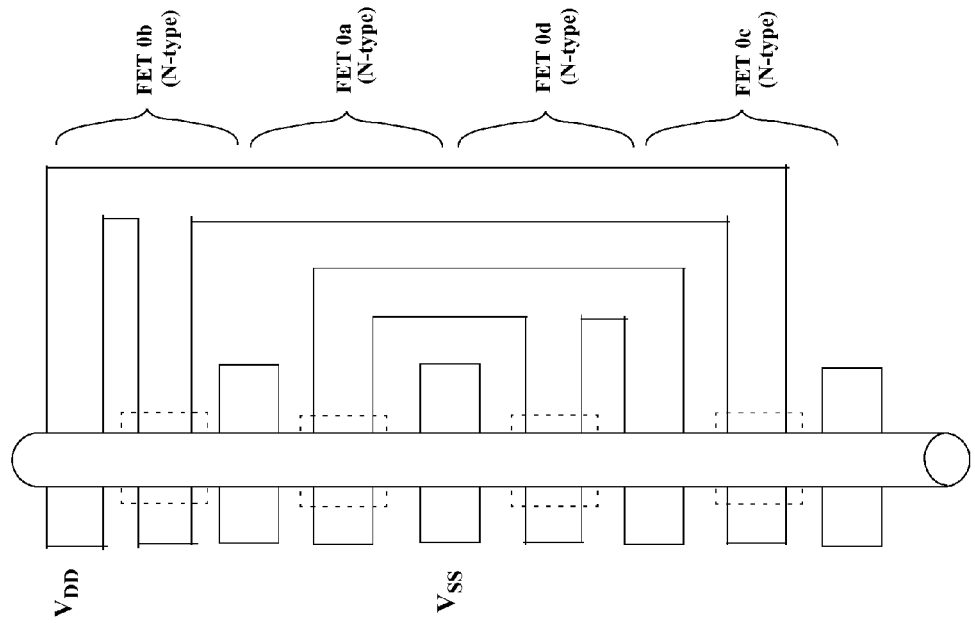
FIG. 14b depicts an exemplary implementation of the current source circuit of FIG. 14a, arranged as a segment on the same carbon nanotube or flat strip of semiconducting material such as a graphene ribbon or printed strip of semiconducting polymer.
Figure 14A:
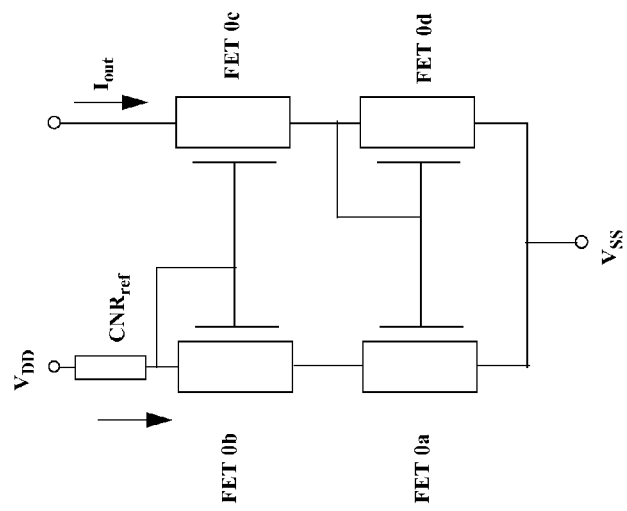
FIG. 14a depicts an exemplary improved Wilson current source.
Figure 15B:
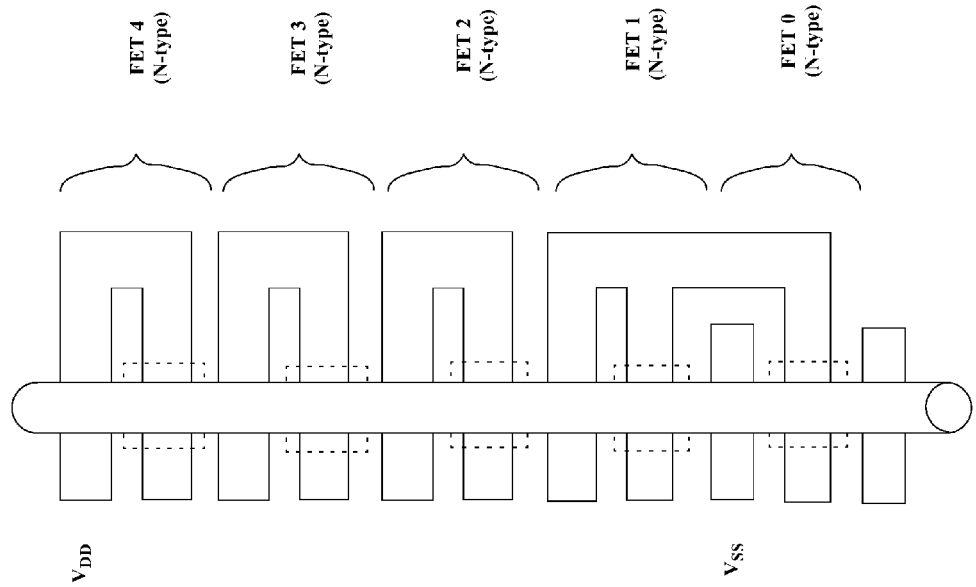
FIG. 15b depicts an exemplary FET-ladder/current-mirror current source.
Figure 15A:
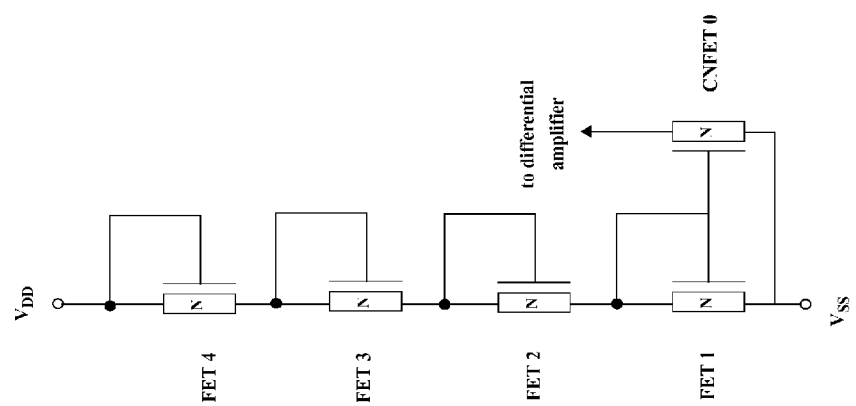

Another aspect taught in co-pending patent application U.S. 61/348,366 is the use of alternate current sources. Such alternate current sources can also be modularized and a collection of such modularized current sources can serve as submodules in larger circuits. As an example of the use of current sources as submodules, FIG. 10 depicts an exemplary configuration wherein an exemplary differential amplifier ladder module that is configured to be driven by two current sources is additionally arranged so as to interconnect with a pair of internally-unspecified current source submodules, one on either side of the exemplary differential amplifier ladder. This exemplary arrangement can also be used with a flat strip of semiconducting material such as a graphene ribbon or printed strip of semiconducting polymer. As examples of such alternate current source submodules:

- FIG. 11*a* depicts an exemplary simple current source employing a current mirror driven by a simple resistive current source;
- FIG. 11*b* depicts an exemplary implementation of the current source circuit of FIG. 11*a*, arranged as a segment on the same carbon nanotube or flat strip of semiconducting material such as a graphene ribbon or printed strip of semiconducting polymer;
- FIG. 12*a* depicts an exemplary cascade current source;
- FIG. 12*b* depicts an exemplary implementation of the current source circuit of FIG. 12*a*, arranged as a segment on the same carbon nanotube or flat strip of semiconducting material such as a graphene ribbon or printed strip of semiconducting polymer;
- FIG. 13*a* depicts an exemplary Wilson current source;
- FIG. 13*b* depicts an exemplary implementation of the current source circuit of FIG. 13*a*, arranged as a segment on the same carbon nanotube or flat strip of semiconducting material such as a graphene ribbon or printed strip of semiconducting polymer;
- FIG. 14*a* depicts an exemplary improved Wilson current source;
- FIG. 14*b* depicts an exemplary implementation of the current source circuit of FIG. 14*a*, arranged as a segment on the same carbon nanotube or flat strip of semiconducting material such as a graphene ribbon or printed strip of semiconducting polymer;
- FIG. 15*b* depicts an exemplary FET-ladder/current-mirror current source;
- FIG. 15*b* depicts an exemplary implementation of the current source circuit of FIG. 15*a*, arranged as a segment on the same carbon nanotube or flat strip of semiconducting material such as a graphene ribbon or printed strip of semiconducting polymer.

In each of FIGS. 11*a*-15*b*, the N-type material can be replaced with P-type material and VDD accordingly replaces VSS so as to provide a complementary current source powered from VDD rather than VSS.

Figure 16A:
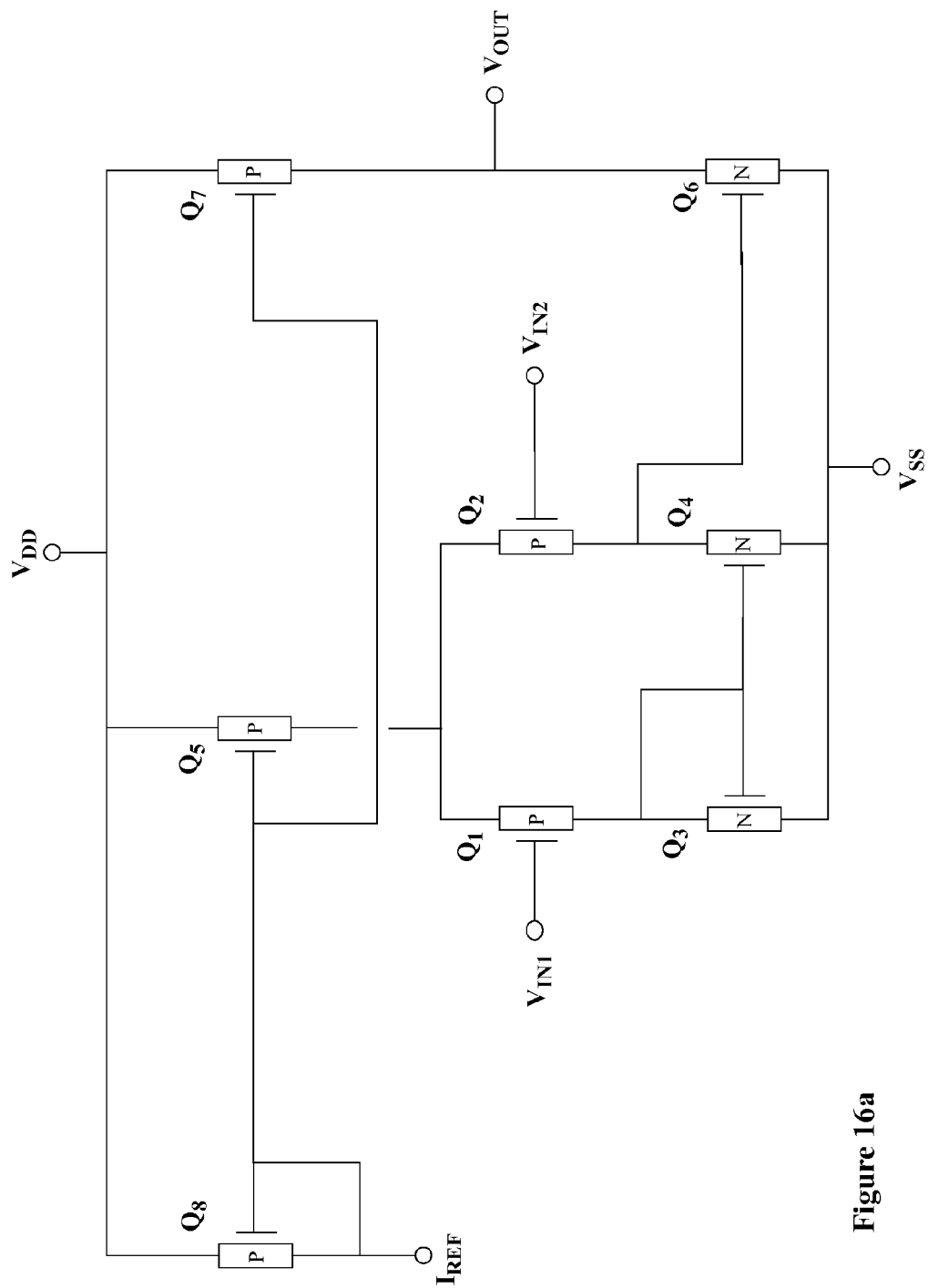
FIG. 16a shows an exemplary two-stage operational amplifier.
Figure 16B:
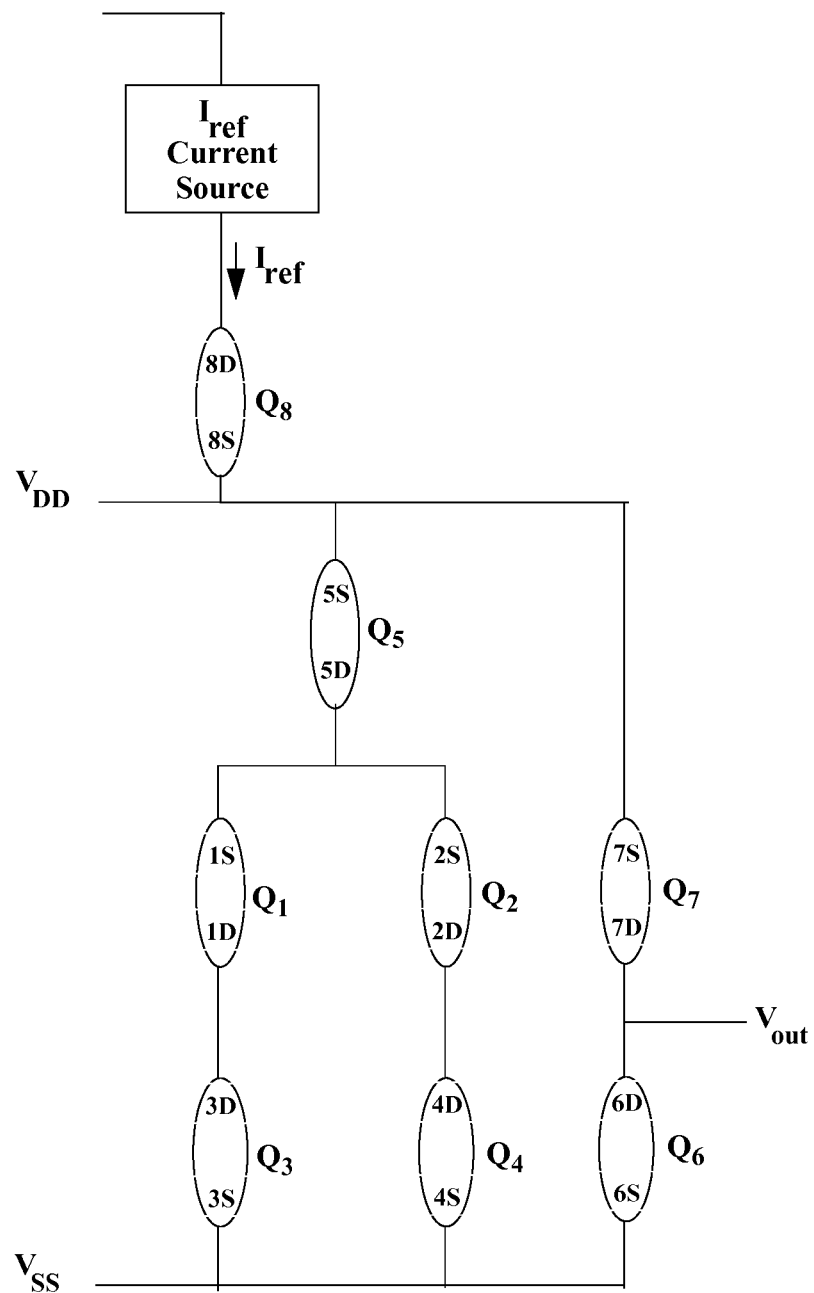

FIG. 16*a* shows an exemplary two-stage operational amplifier. FIG. 16*b* illustrates the extremal terminal interconnections of the eight transistors and current source comprising the circuit of FIG. 16*a*. At this point, additional circuit design techniques can be applied so as to create an adapted, related, or alternate circuit design so that comprises a single chain terminating in power supply terminals so as to be in keeping with the modular structure arrangements depicted in FIGS. 3*a* and 3*b*.

Figure 16C:
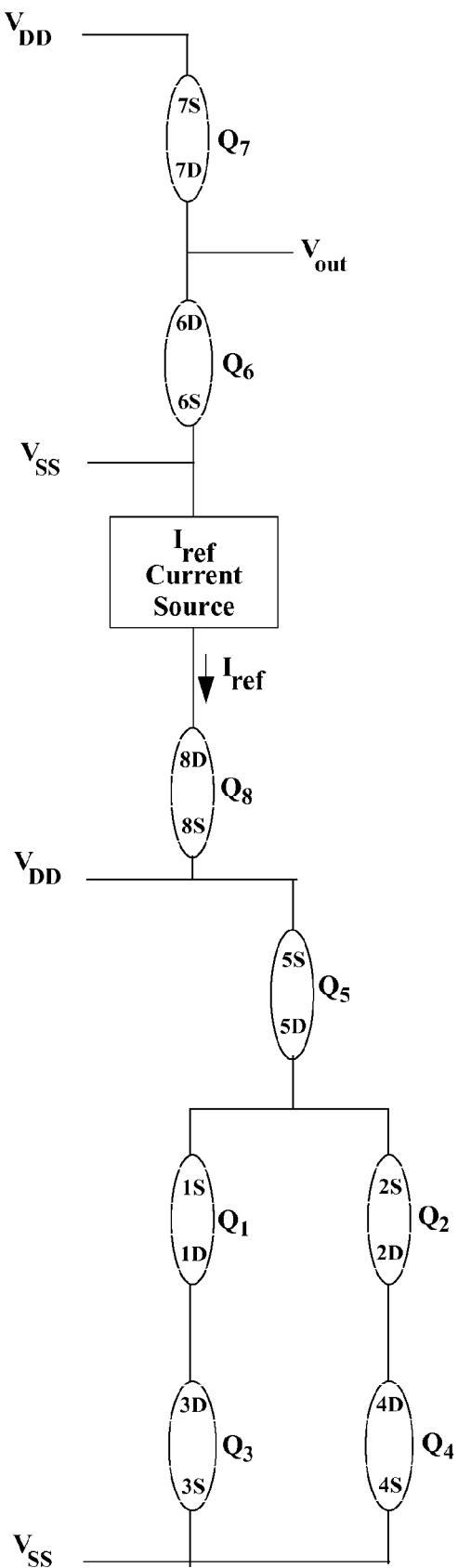
FIG. 16c shows and adaptation of the arrangement FIG. 16b employing a $V_{SS}$-terminated current source, moving of FET6 and FET7 sub-chain to the $V_{SS}$ power supply terminal of the $V_{SS}$-terminated current source, and providing a new $V_{DD}$ power supply terminal.

Because of the direction of the current flow and that is directed through FET8 to $V_{DD}$, a $V_{SS}$-terminated current source (such as the resistor-FET0 ones employed in FIGS. 5*a*-9*b*, or, alternatively any of those depicted in FIGS. 11*a*-15*b*) can use used. FIG. 16*c* shows use of a $V_{SS}$-terminated current source and the moving of FET6 and FET7 sub-chain to the $V_{SS}$ power supply terminal of the $V_{SS}$-terminated current source (rather than the $V_{SS}$ power supply terminal used in FIG. 16*b*) and providing a new $V_{DD}$ power supply terminal (rather than the $V_{DD}$ power supply terminal used in FIG. 16*b*).

Figure 16D:
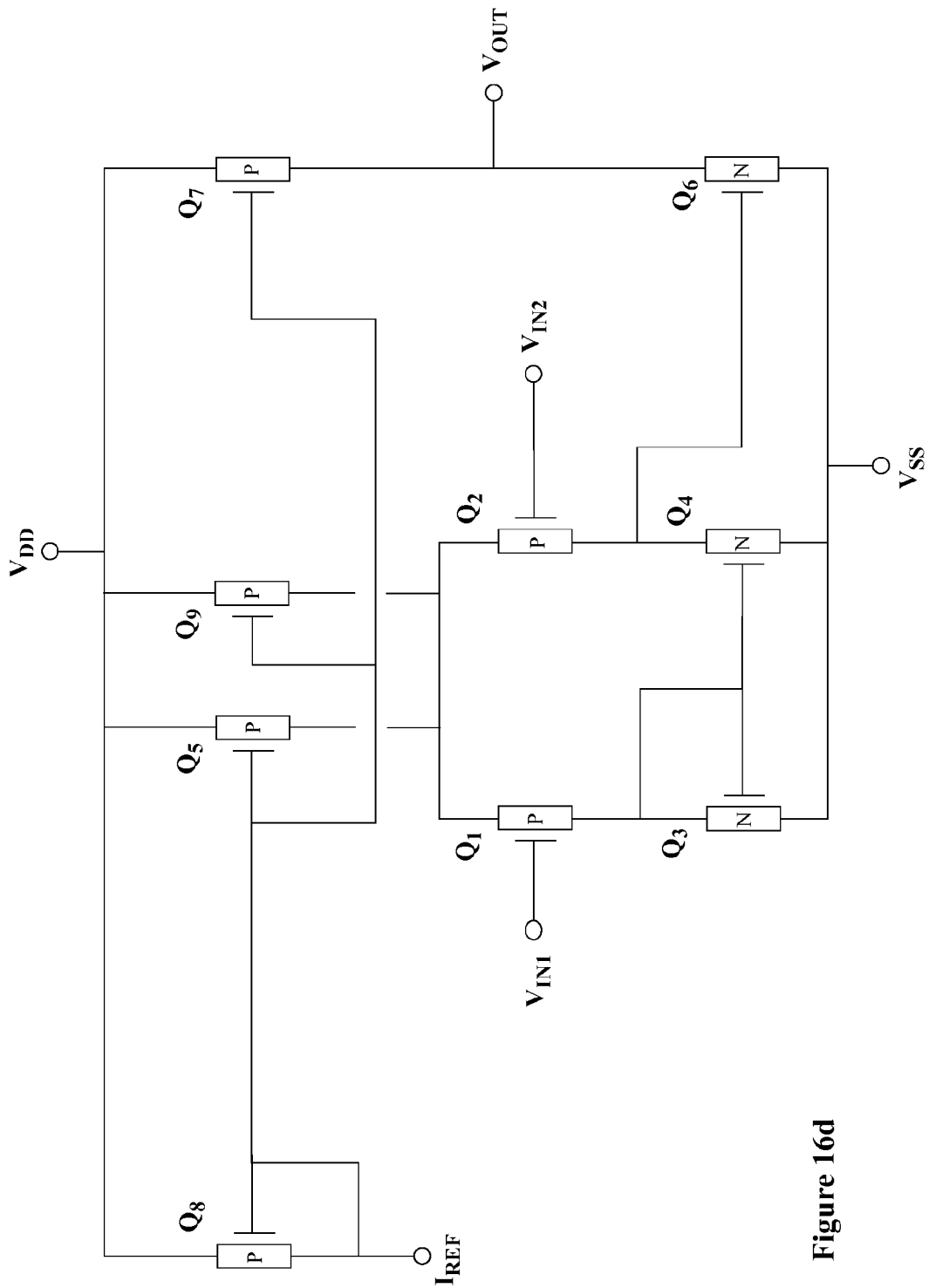
FIG. 16d shows the addition of a second current mirror current source Q9 to the differential ladder.

FIG. 16*d* shows the addition of a second current mirror current source Q9 to the differential ladder. In this case, the second current mirror current source Q9, like Q5, is driven by the aforedescribed $I_{REF}$ current source. This allows the differential ladder to be implemented, as in the many examples above, as a sub-chain with both ends terminating in a power supply terminal. In this case, the differential ladder is constructed in the complementary arrangement (with P-type and N-type FETs exchanged and with $V_{SS}$ and $V_{DD}$ power supply terminals exchanged), so here both sub-chain ends terminating in a $V_{DD}$ power supply terminal (rather than $V_{SS}$ power supply terminal was in the case for the arrangement of FIG. 7*a*).

Figure 16E:
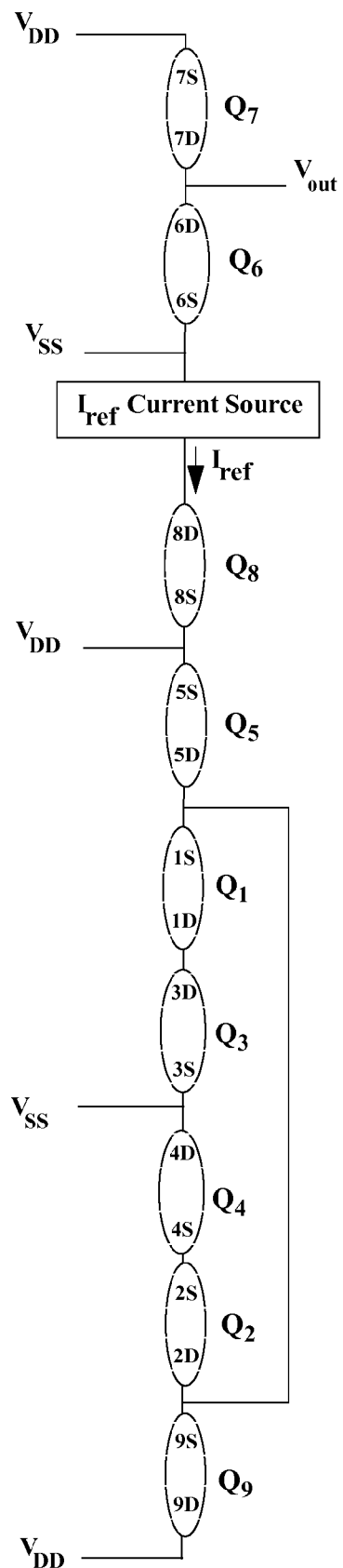
FIG. 16e shows a resulting arrangement derived from that of FIG. 16d wherein sub-chain ends terminating in a $V_{DD}$ power supply terminal. Here, the power supply terminals depicted in FIGS. 3a and 3b are alternately $V_{SS}$ and $V_{DD}$ power supply terminals.

The final arrangement is shown in FIG. 16*e*. In this case, the power supply terminals depicted in FIGS. 3*a* and 3*b* are alternating $V_{SS}$ and $V_{DD}$ power supply terminals. In this construction, various submodule interpretations and constructions can be employed. In keeping with the examples above, each of these paths can be realized by a single carbon nanotube, a single graphene ribbon, or a single strip of (dopable) semiconducting polymer.

The aforementioned techniques can be applied to digital and mixed analog/digital circuits involving large numbers of nanotransistors such as field-effect nanotube transistors.

Additional Printed Electronics Considerations

In general, the various "inks" used in a chain/leapfrog printable electronics realization can be structured in various ways. One example is the collection:
- N-type Material;
- P-type Material;
- Intrinsic Material;
- Conductor Material;
- Insulator Material;
- (Resistive Material);
- (Dielectric Material).

A second example is the collection:
- Intrinsic Material;
- N-type Doping;
- P-type Doping;
- Conductor Material;
- Insulator Material;
- (Resistive Doping);
- (Dielectric Doping).

A third example is the collection:
- N-type Doping;
- P-type Intrinsic;
- Conductor Material;
- Insulator Material;
- (Resistive Doping);
- (Dielectric Doping).

A fourth example is the collection:
- N-type Intrinsic;
- P-type Doping;
- Conductor Material;
- Insulator Material;
- (Resistive Doping);
- (Dielectric Doping).

Figure 17:
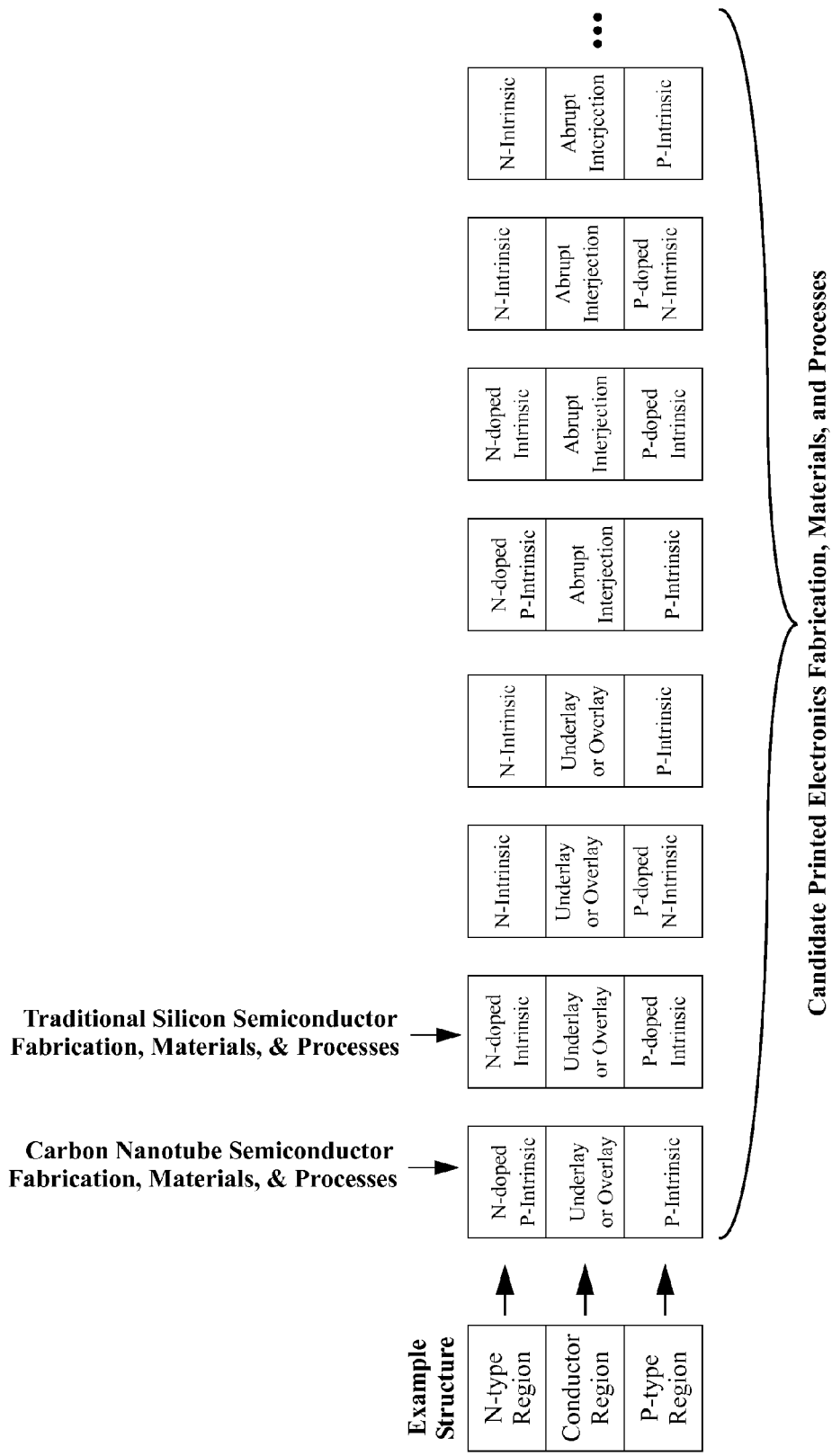
FIG. 17 shows an example of this wherein a simple example structure (here an adjacent contiguous N-type region, conductor region, and P-type region) is shown mapped to at least eight types of fabrication techniques, associated materials, and associated processes.

Many other examples and approaches are possible, as suggested in FIG. 17 which shows an example wherein a simple example structure (here an adjacent contiguous N-type region, conductor region, and P-type region) can be mapped to at least eight types of fabrication techniques, associated materials, and associated processes, each of these types pertaining to a particular electronics component rendering approach. Each such a mapping can be implemented algorithmically for execution on a computer, for example as part of or in conjunction with the computer systems and data arrangements to be described that are associated with FIGS. 18-21 to follow.

In the above, the collection can optionally include (as indicated parenthetically) resistive materials or dopants so as to provide realization of specific values of resistor elements. Similarly, the collection can optionally include (as indicated parenthetically) dielectric materials or dopants so as to provide realization of specific values of capacitive elements.

Additionally, The invention provides for:
ink layering;
ink mixing, for example in order to introduce dopants;
spatial gradients to created by variable-proportion ink mixing, for example as can be used to make graded junction semiconductor material and devices;
abrupt contiguous junctions between adjacent electrically-contacting regions of materials;
ink deposition of optically transmissive material, for example as can be used to render an optical transmission channel for optical interconnection among circuit elements as described in co-pending U.S. patent application U.S. Ser. No. 12/033,212.

Figure 18:
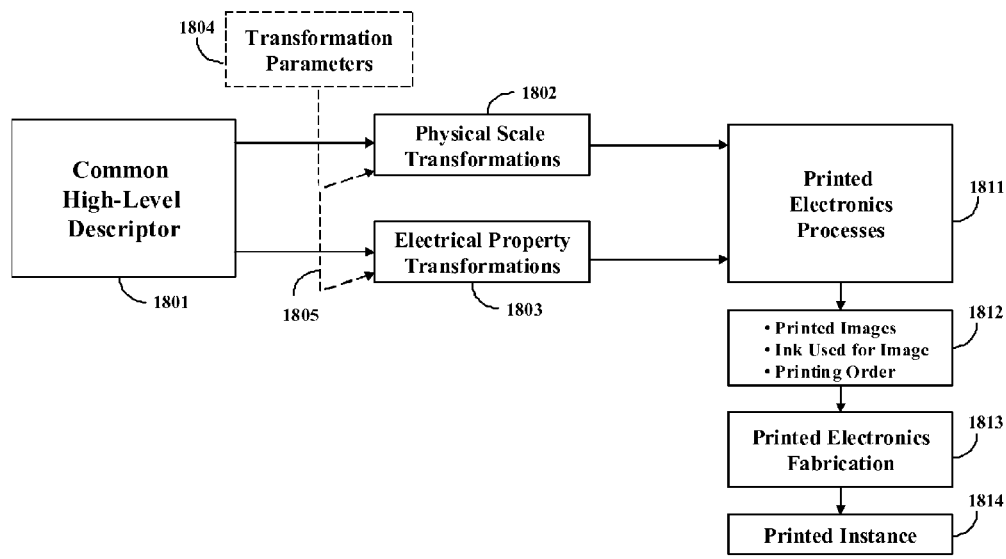
FIG. 18 depicts an exemplary approach to printed electronics as provided for by the invention.

An exemplary approach to printed electronics as provided for by the invention is illustrated in FIG. 18. Here design parameters, attributes, and elements in terms of a Common High-Level Descriptor 1801 are presented to physical scale transformations 1802 and/or electrical property transformations 1803. One or both of these transformations, if present, can be controllable under the influence of transformation parameters 1804 by means for transport parameter communications 1805. These transformations map the Common High-Level Descriptor 1801 design parameters, attributes, and elements to printed electronics design parameters, attributes, and elements in terms of carbon nanotube and/or graphene ribbon electronic processes 1811. These are mapped into actions 1812 for printed electronics fabrication 1813. In an exemplary embodiment, these actions comprise specific images to be printed, the inks the images are to be printed with, and the order in which these images are to be printed. The output printed electronics fabrication 1813 comprises at least one printed instance 1814.

In an embodiment, design parameters, attributes, and elements may be provided in terms of nanoscale electronics (carbon nanotube, graphene ribbon electronic processes, semiconducting polymer nanoelectronics, etc.) and transformations may be used to map these design parameters, attributes, and elements to printed electronics.

Leveraging Selected Classes of Physical Fabrication Approaches to Create Universal Design Framework and Software Tools As repeatedly described, the techniques taught throughout the present patent specification can be applied to several types of semiconducting materials and physical fabrication methods and in the case of printed electronics at a variety of physical scales. In particular, with proper choices of semiconducting polymers and printed electronics "ink" materials, the same high-level design can be applied for at least six target technology realizations:

carbon nanotube nanoelectronics;
graphene nanoribbon nanoelectronics;
semiconducting polymer nanoelectronics;
larger scale semiconducting polymer electronics;
nanoscale printed electronics;
traditional (micrometer, millimeter, or larger scale) printed electronics.

Each of the above six target technology realizations can employ one or more fabrication techniques, associated materials, and associated processes. The various fabrication techniques, associated materials, and associated processes can be mapped from a common high-level descriptor. FIG. 17 shows an example of this wherein a simple example structure (here an adjacent contiguous N-type region, conductor region, and P-type region) is shown mapped to at least eight types of fabrication techniques, associated materials, and associated processes. The first example on the left in the sequence is representative of carbon nanotube semiconductor electronics fabrication techniques, associated materials, and associated processes, but can also apply to other situations, for example printed electronics (as shown). Similarly, the second example from the left in the sequence is representative of traditional silicon semiconductor electronics fabrication techniques, associated materials, and associated processes, but can also apply to other situations, for example again printed electronics (again as shown).

Additionally, employing the types of devices described thus far, most if not nearly all of the detail of the specialized physics and models associated with each of the aforementioned six target technology realizations can be suppressed, readily permitting re-use of models and techniques among the aforementioned six target technology realizations as well as other types of nanotransistors and molecular transistors, Further, the present invention also provides an important vehicle to make design, prototyping, simulation, and fabrication relatively straightforward for broader populations of circuit designers to conceive of meaningful circuits and systems to design.

Additionally, this common framework and the techniques mentioned above provide a setting very amenable to software-based circuit simulation systems. The transistors can be limited to as few as one or two types that readily lend themselves to modeling with circuit simulation systems such as SPICE. Further, only a few other shared carbon-nanotube/graphene-ribbon electronic elements (diode structures, resistor structures, capacitor structures) are needed for the "component" data library, and these also readily lend themselves to modeling with circuit simulation systems such as SPICE. The component data library can comprise adapted FET models, and can be augmented to provide options to selectively include special modeling features for tunneling, CN junction transistors, single-electron transistors, ballistic electron transistors, etc.

Thus the present invention provides a common framework and techniques for designing and layout of a class of nanoelectronics in each of the aforementioned six target technology realizations, extendable to other types of nanotransistors and molecular transistors.

Figure 19:
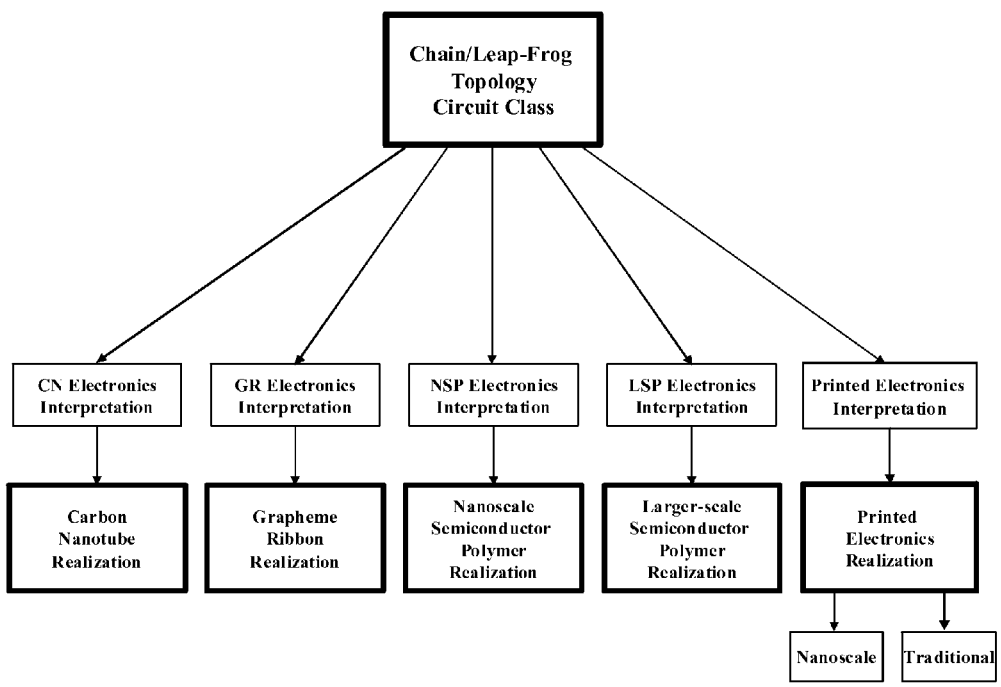
FIG. 19 depicts a common framework for corresponding chain/leapfrog classes of carbon nanotube electronics, graphene ribbon electronics, semiconducting polymer chains or other at nanoscale or larger scale, and printed electronics as provided for by the invention.

Leveraging the Universal Design Framework to Employ Printed Electronics as a Nanoelectronics Emulation Prototyping Tool Further, in that the techniques can be extended to other types of physically-linear-geometry semiconductors, such as semiconducting polymer chains at nanoscale or larger scale, and in particular can be extended to apply to printed electronics, the present invention provides a framework for the use of chain/leapfrog printable electronics as a prototyping aid for emulating the corresponding chain/leapfrog classes of carbon nanotube electronics, graphene ribbon electronics, and semiconducting polymer chains or other at nanoscale or larger scale. This is illustrated in FIG. 19.

In one embodiment of the invention, the conducting, insulating, semiconducting, and other "inks" used in a chain/leapfrog printable electronics realization are chosen to match or nearly approximate aspects of the electrical behavior and operative device structures of a direct emulation target such as chain/leapfrog carbon nanotube electronics, chain/leapfrog graphene ribbon electronics, and nanoscale chain/leapfrog semiconducting polymers.

In another embodiment of the invention, the inks and subordinate structures used in the extensions to printable electronics can be adapted and combined with printable or other substrate structures to serve as scaled-up physical prototypes that can be interpreted through computer software so as to compensate for scale and/or minor differences.

In another embodiment of the invention, the inks and subordinate structures used in the extensions to printable electronics can be adapted and combined with printable or other substrate structures to serve as scaled-up physical prototypes that can be interpreted through computer software so as to numerical impose additional effects that cannot be directly emulated.

In another embodiment of the invention, combinations of aspects of two or more of the above embodiments are used.

Figure 20:
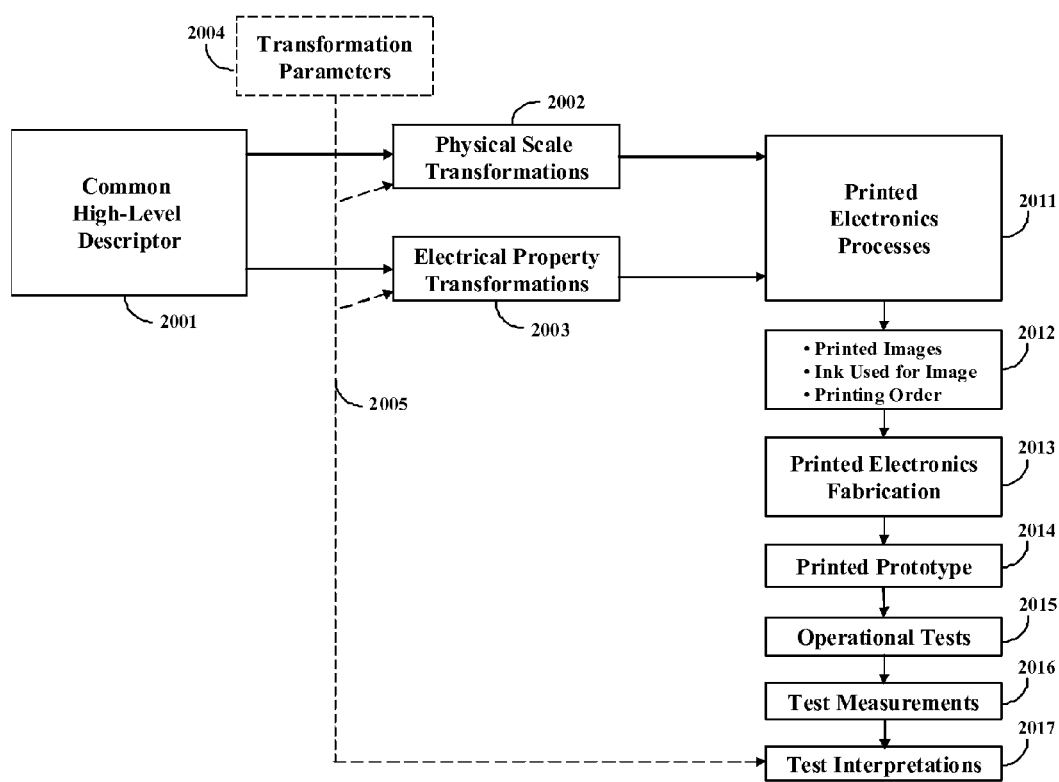
FIG. 20 depicts an exemplary overall approach to the emulation environment as provided for by the invention.

An exemplary overall approach to the emulation environment as provided for by the invention is illustrated in FIG. 20. Here design parameters, attributes, and elements in terms of carbon nanotube and/or graphene ribbon electronic processes 2001 are presented to physical scale transformations 2002 and/or electrical property transformations 2003. One or both of these transformations, if present, can be controllable under the influence of transformation parameters 2004 by means for transport parameter communications 2005. These transformations map the carbon nanotube and/or graphene ribbon design parameters, attributes, and elements in terms of carbon nanotube and/or graphene ribbon electronic processes 2001 to printed electronics design parameters, attributes, and elements in terms of carbon nanotube and/or graphene ribbon electronic processes 2011. These are mapped into actions 2012 for printed electronics fabrication 2013. In an exemplary embodiment, these actions comprise specific images to be printed, the inks the images are to be printed with, and the order in which these images are to be printed. The output printed electronics fabrication 2013 comprises at least one printed prototype 2014 which in prototype use and testing is subjected to one or more operational tests 2015 that produce test measurement data 2016 that can be interpreted by test interpretations 2017. In some versions of the exemplary embodiment, the test interpretations 2017 can be controllable under the influence of transformation parameters 2004 by means for transport parameter communications 2005.

In another embodiment provided for by the invention, the arrangement of FIG. 20 is adapted to include or, alternatively replace carbon nanotube and/or graphene ribbon electronic processes with semiconductor polymer electronic processes at the nanoscale and/or at a larger scale.

Exemplary Overall Design, Simulation, and Emulation Methods and Software Tools

Exemplary approaches to overall design software tools and simulation software tools as provided for by the invention are now presented. Some example arrangements provided for by the invention are illustrated in FIGS. 21-30.

The overall design software tools and/or simulation software tools may run on single computer, or may be configured to run as a distributed process across several computers. In an embodiment, an overall design software tools as described below, or as extended by one knowledgeably skilled in the art, create fabrication data pertaining to a selected one from a plurality of electronics component rendering approaches. This fabrication data for subsequent use by fabrication process technology pertaining to the selected electronics component rendering approach.

In an embodiment, a chain/leapfrog topology circuit design software tool and/or simulation software tool comprises a user interface for receiving design instructions from a user.

In an embodiment, fabrication data is created by a chain/leapfrog topology circuit design software tool responsive to design instructions received from a user.

In an embodiment, design instructions received from a user are at least in part provided by the user in the form of a file.

In an embodiment, design instructions received from a user are at least in part provided by the user via the user's interactions with a user interface.

In an embodiment, design instructions received from a user are provided in entirety by the user in the form of a file.

In an embodiment, design instructions received from a user are in entirety by the user via the user's interactions with a user interface.

Figure 21:
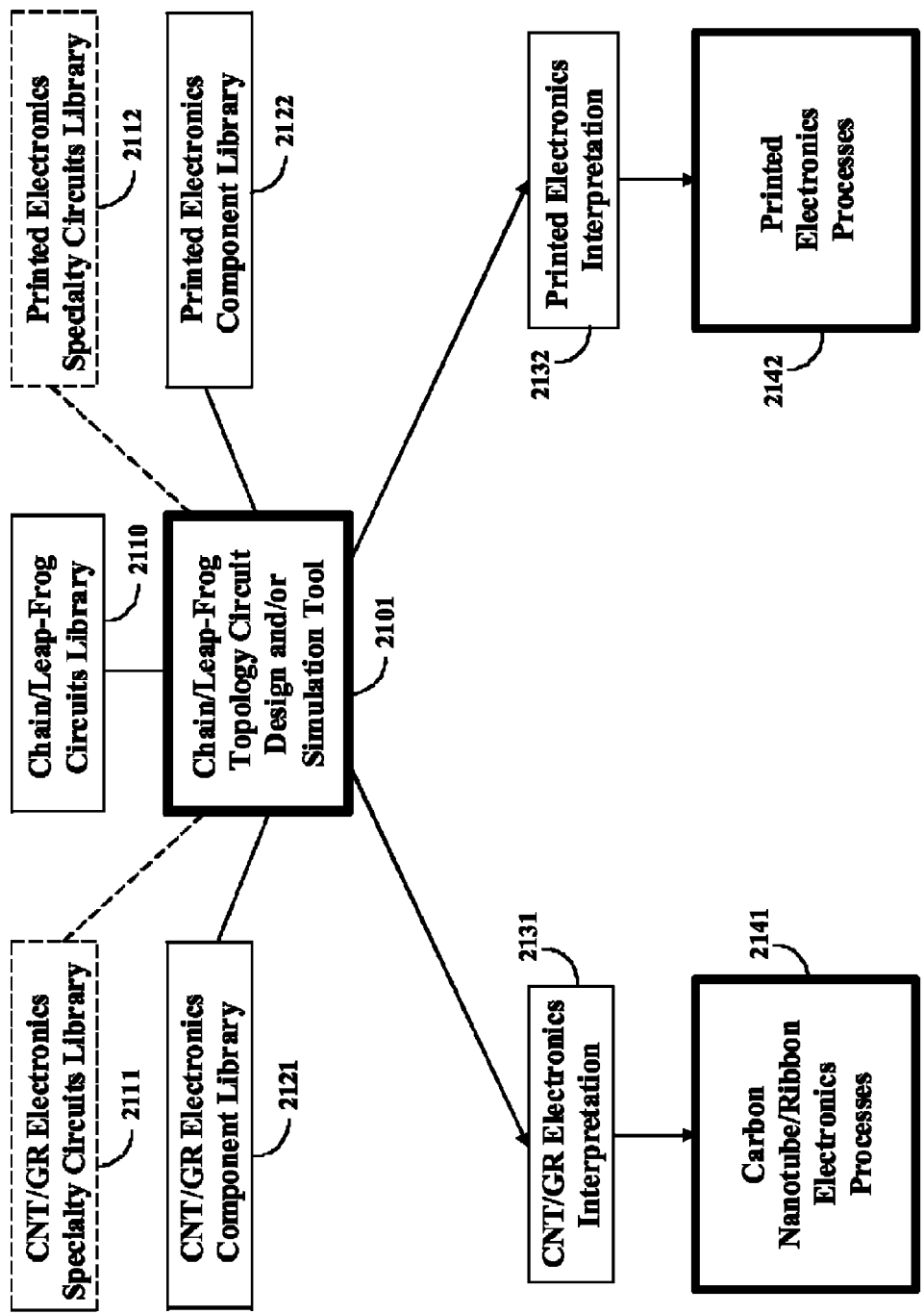
FIGS. 21-30 depict exemplary approaches to overall design software tools and simulation software tools as provided for by the invention.

Referring to FIG. 21, a chain/leapfrog topology circuit design software tool and/or simulation software tool 2101 draws from a chain/leapfrog circuits data library 2110 and one or more of a carbon nanotube and/or graphene ribbon electronic component data library 2121 and a printed electronics component data library 2122. In some embodiments, the chain/leapfrog topology circuit design software tool and/or simulation software tool 2101 can be realized with SPICE or utilizing one or more other pre-existing circuit design software tools and/or simulation software tools. In other embodiments, the chain/leapfrog topology circuit design and/or simulation tool 2101 can be realized with specialized software. In other embodiments, one or more pre-existing circuit design software tools and/or simulation software tools can be combined with specialized software.

In some embodiments, correspondences can be made between a component in carbon nanotube and/or graphene ribbon electronic component data library 2121 and a component in the printed electronics component data library 2122.

In some embodiments, the carbon nanotube and/or graphene ribbon electronic component data library 2121 and a printed electronics component data library 2122 can be identical and/or the same data library.

In an embodiment, the chain/leapfrog circuits data library comprises designs for a plurality of chain/leapfrog circuit modules.

In an embodiment, the chain/leapfrog circuits data library 2110 can include or be supplemented by one or more "specialty" circuit libraries specialized to certain types of circuit realizations. For example, the software and data can include access and data to one or more of:

A carbon nanotube and/or graphene nanoribbon specialty circuits library 2111;
A printed electronics specialty circuits library 2112 for one or both of:
Nanoscale printed electronics;
Traditional printed electronics;
A semiconducting polymer specialty circuits library for one or both of:
Semiconducting polymer nanoelectronics;
Larger scale semiconducting polymer electronics.

In some embodiments, the chain/leapfrog topology circuit design and/or simulation tool 2101 can additionally draw from a carbon nanotube and/or graphene ribbon specialty circuits data library 2111.

In some embodiments, the chain/leapfrog topology circuit design software tool and/or simulation software tool 2101 can additionally draw from a printed electronics specialty circuits data library 2112.

In some embodiments, the chain/leapfrog topology circuit design software tool and/or simulation software tool 2101 can additionally draw from a semiconducting polymer specialty circuits data library.

In some embodiments, correspondences can be made between a circuit in the carbon nanotube and/or graphene ribbon specialty circuits data library 2111 and a circuit in the printed electronics specialty circuits data library 2112.

In some embodiments, correspondences can be made between a component in carbon nanotube and/or graphene ribbon electronic component data library 2121 and a circuit in the printed electronics specialty circuits data library 2112.

In some embodiments, correspondences can be made between a circuit in the carbon nanotube and/or graphene ribbon specialty circuits data library 2111 and a component in the printed electronics component data library 2122.

In some embodiments the printed electronics component data library comprises component data for printed electronics components that directly correspond to one or more types of nanoelectronics components (for example, as may be realized by carbon nanotubes, graphene nanoribbons, semiconducting polymer nanoelectronics, etc.).

In some embodiments, the chain/leapfrog topology circuit design and/or simulation tool 2101 can additionally provide a carbon nanotube and/or graphene ribbon electronics interpretation 2131 manifest in or presented to carbon nanotube and/or graphene ribbon electronics processes 2141.

In some embodiments, the chain/leapfrog topology circuit design software tool and/or simulation software tool 2101 can additionally provide a printed electronics interpretation 2132 manifest in or presented to printed electronics processes 2142.

In an embodiment, the software facilitates the use of traditional scale printed electronics as an emulation tool for chain/leapfrog topology nanoelectronics circuits.

In an embodiment, the invention supplements the use of traditional scale printed electronics as an emulation tool for chain/leapfrog topology nanoelectronics circuits with software models providing mappings, transformations, simulations, and/or interpretations between the differences in the physics and electrical behavior of traditional scale printed electronics and the physics and electrical behavior of the nanoelectronics circuits.

In an embodiment, the software provides for "IP cores," "System-on-a-nanotube," and other related modular design approaches as taught in co-pending U.S. patent applications U.S. Ser. No. 12/025,562 with a priority date of Feb. 5, 2007, U.S. Ser. No. 12/033,212 with a priority date of Feb. 17, 2007, and U.S. 61/348,366 with a priority date of May 26, 2010.

Figure 22:
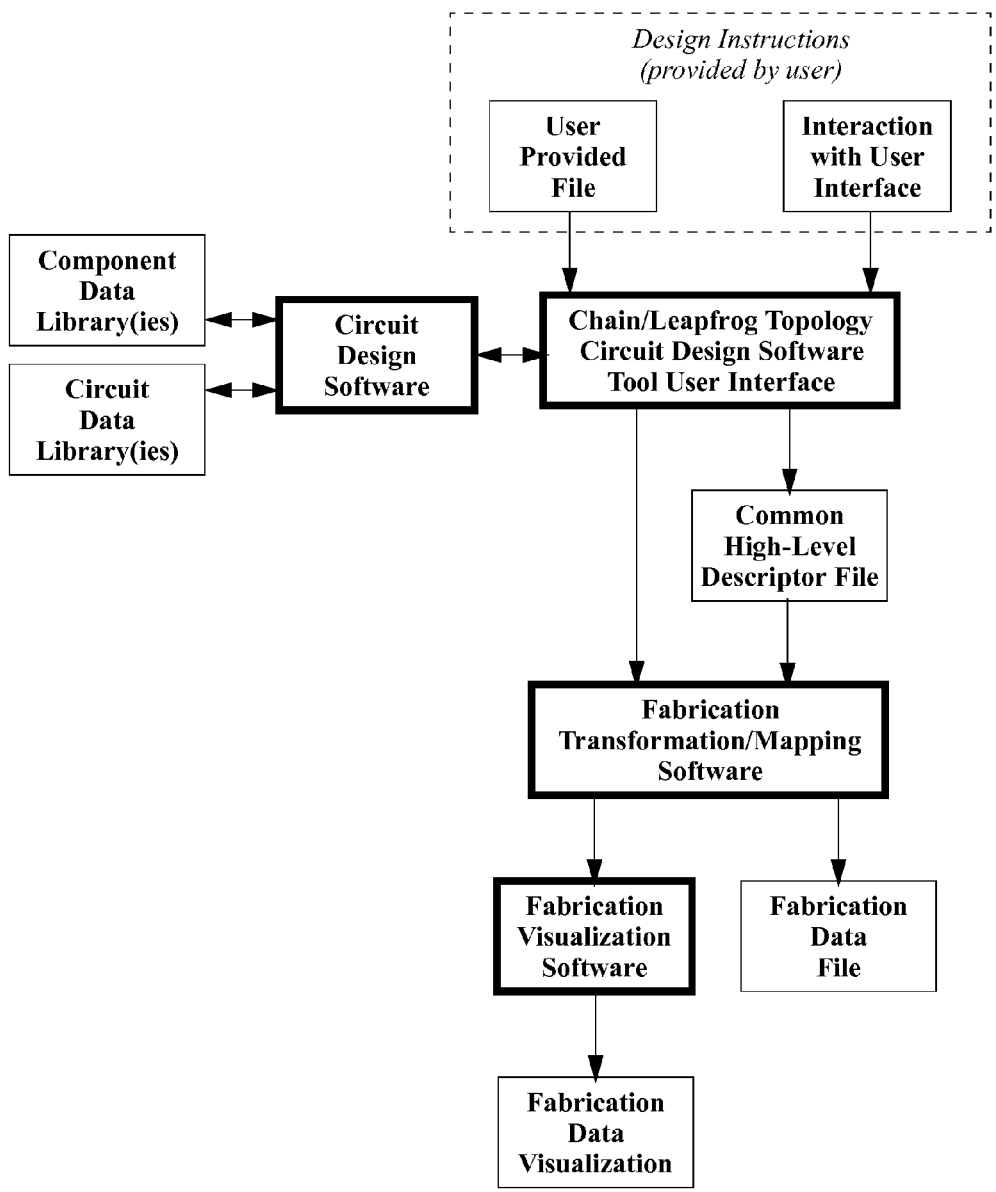

FIG. 22 depicts an exemplary range of embodiments. In this figure, the boxes with thicker borders represent software while boxes with thinner borders depict data. Design instructions are provided by the user in the form of a user provided file and/or the user's interaction with a user interface. The design instructions are directed through a chain/leapfrog topology design software user interface. The chain/leapfrog topology design software user interface interacts with circuit design software, which in turn as needed accesses one or more component data library/libraries and/or one or more circuit data library/libraries. In this exemplary embodiment the chain/leapfrog topology design software user interface retains the current design information and produces at least one common high-level descriptor file relevant to at least one type of nanoelectronics realization (carbon nanotubes, graphene ribbons, semiconducting polymer nanoelectronics, etc.). The common high-level descriptor file is then provided to one or more selected instances of fabrication transformation/mapping software corresponding to a selected fabrication method or process. In this exemplary embodiment the one or more selected fabrication method(s) or process(es) can be selected from the chain/leapfrog topology design software user interface. The one or more selected instances of fabrication transformation/mapping software transform the common high-level descriptor file into an associated fabrication data file comprising fabrication data pertaining to the selected fabrication method and/or process associated with a electronics component rendering approach. This fabrication data can be subsequently used by fabrication process technology pertaining to the selected electronics component rendering approach. In this exemplary embodiment the fabrication transformation/mapping software also provides data to fabrication visualization software that produces one or more visualization(s) of fabrication data.

Figure 23:
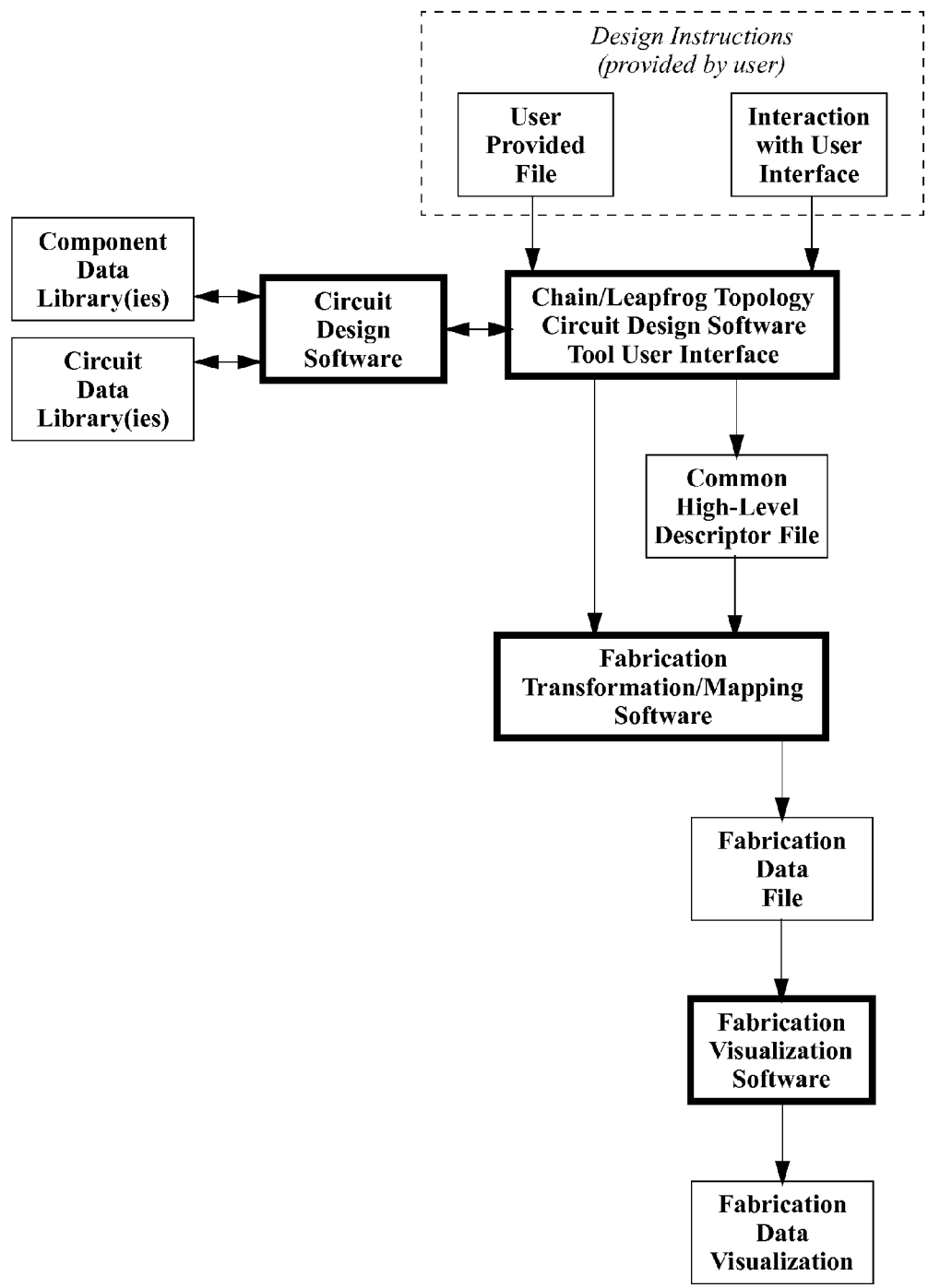

FIG. 23 depicts a slightly altered exemplary range of embodiments wherein the to fabrication visualization software is driven by the fabrication data file. In this figure, the boxes with thicker borders represent software while boxes with thinner borders depict data.

Figure 24:
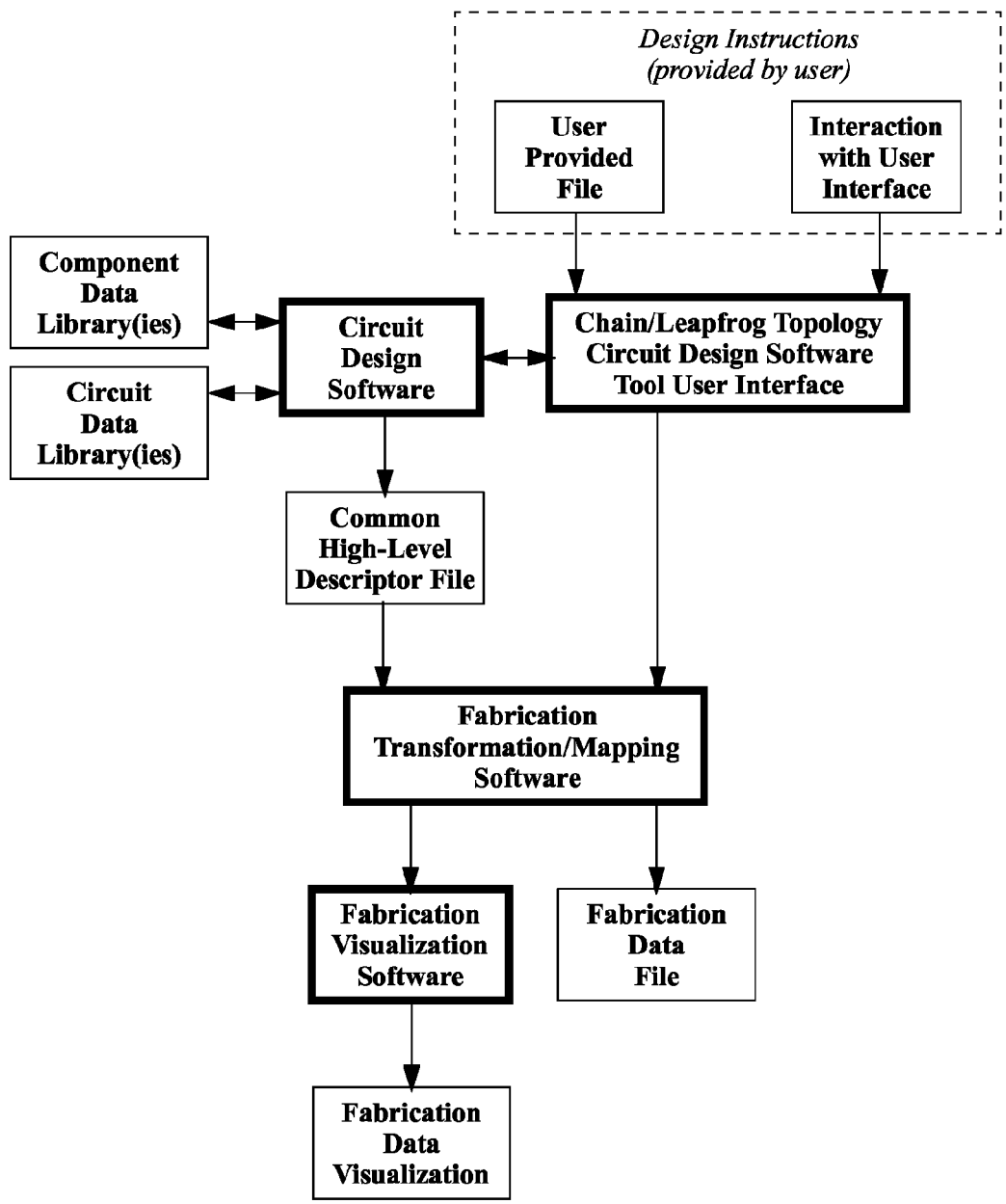

FIG. 24 depicts a slightly altered exemplary range of embodiments. In this exemplary embodiment the circuit design software retains the current design information and produces at least one common high-level descriptor file relevant to at least one type of nanoelectronics realization (carbon nanotubes, graphene ribbons, semiconducting polymer nanoelectronics, etc.). In this figure, the boxes with thicker borders represent software while boxes with thinner borders depict data.

Figure 25:
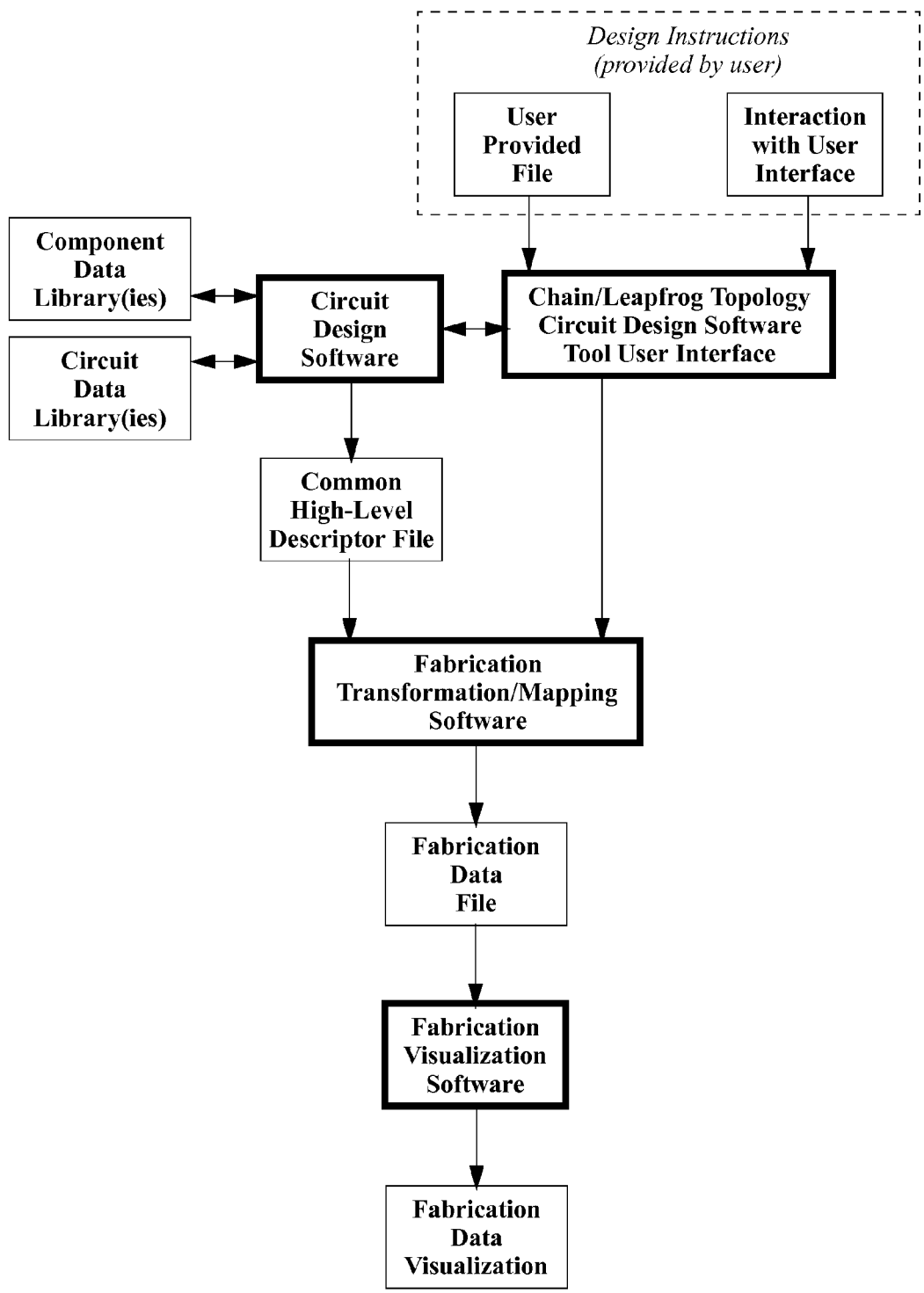

FIG. 25 depicts an exemplary combination of the altered exemplary embodiments depicted in FIGS. 23 and 24. In this figure, the boxes with thicker borders represent software while boxes with thinner borders depict data. In this exemplary embodiment the one or more selected fabrication method(s) or process(es) can be selected from the chain/leapfrog topology design software user interface.

Figure 26:
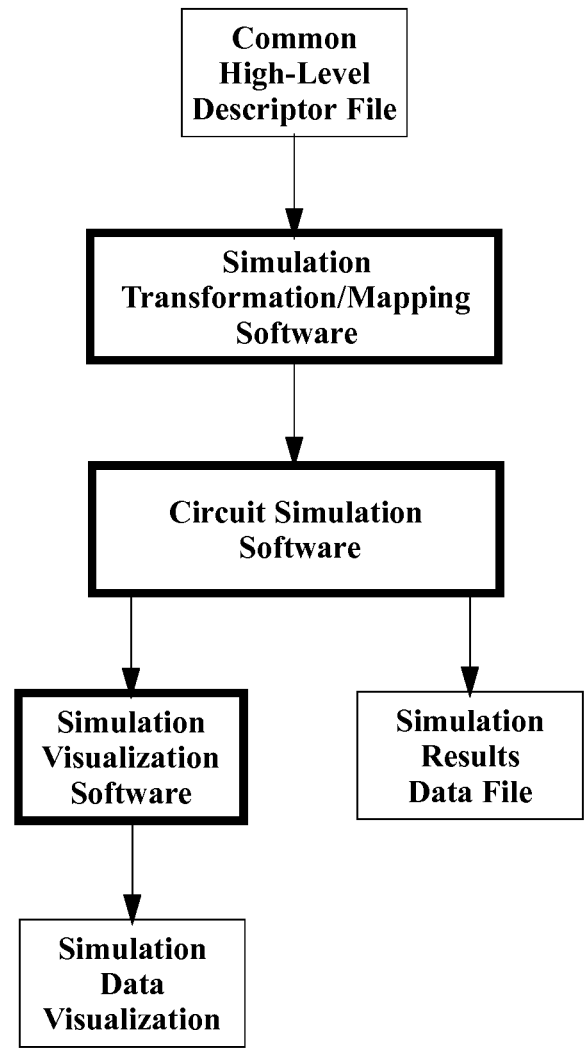

FIG. 26 depicts an exemplary embodiment of a simulation software tool as provided for by the invention. In this figure, the boxes with thicker borders represent software while boxes with thinner borders depict data. A common high-level descriptor file is provided to one or more selected instances of simulation transformation/mapping software corresponding to a selected fabrication method or process. The one or more selected instances of simulation transformation/mapping software transform the common high-level descriptor file into an associated simulation results data file comprising simulation data pertaining to the selected fabrication method and/or process associated with a electronics component rendering approach. This simulation data can be subsequently used by other analysis or publishing tools. In this exemplary embodiment the simulation transformation/mapping software also provides data to simulation visualization software that produces one or more visualization(s) of simulation data.

Figure 27:
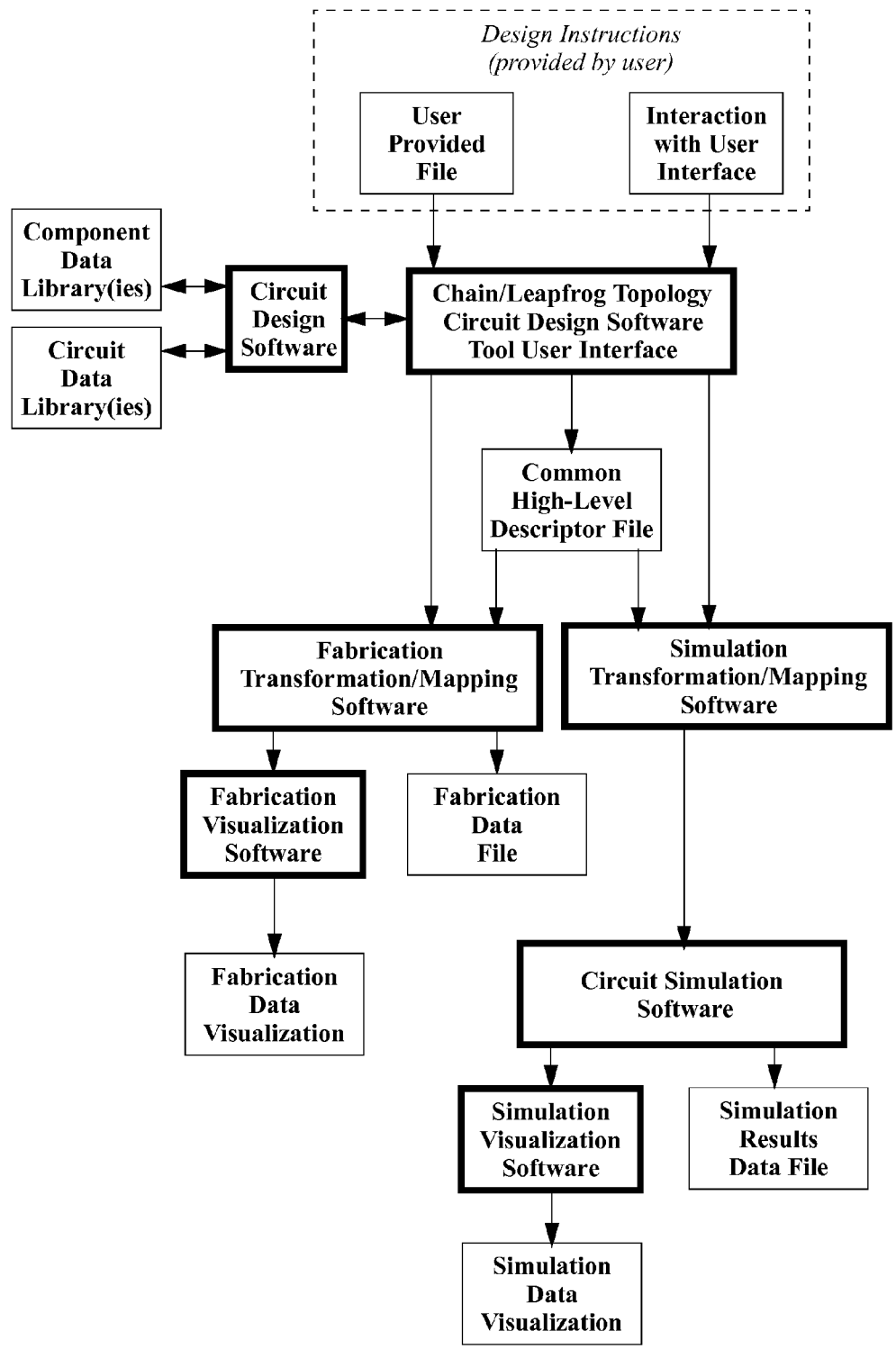

FIG. 27 depicts an exemplary combination of the exemplary embodiments depicted in FIGS. 22 and 26. In this figure, the boxes with thicker borders represent software while boxes with thinner borders depict data. In this exemplary embodiment the one or more selected fabrication method(s) or process(es) can be selected from the chain/leapfrog topology design software user interface.

Figure 28:
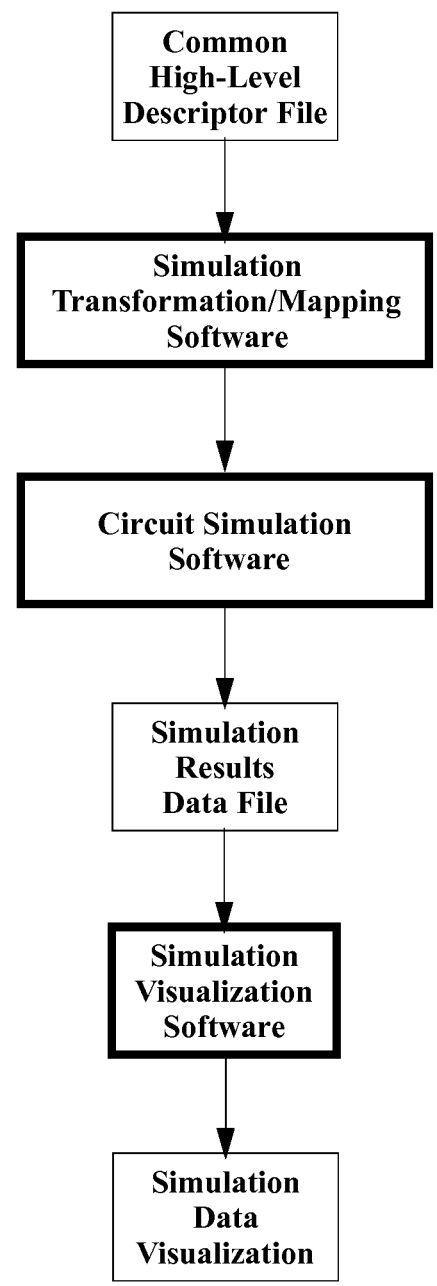

FIG. 28 depicts a slightly altered exemplary embodiment of the arrangement depicted in FIG. 26. In this figure, the boxes with thicker borders represent software while boxes with thinner borders depict data. In this exemplary embodiment the simulation visualization software is driven by the simulation results data file. In this figure, the boxes with thicker borders represent software while boxes with thinner borders depict data.

Figure 29:
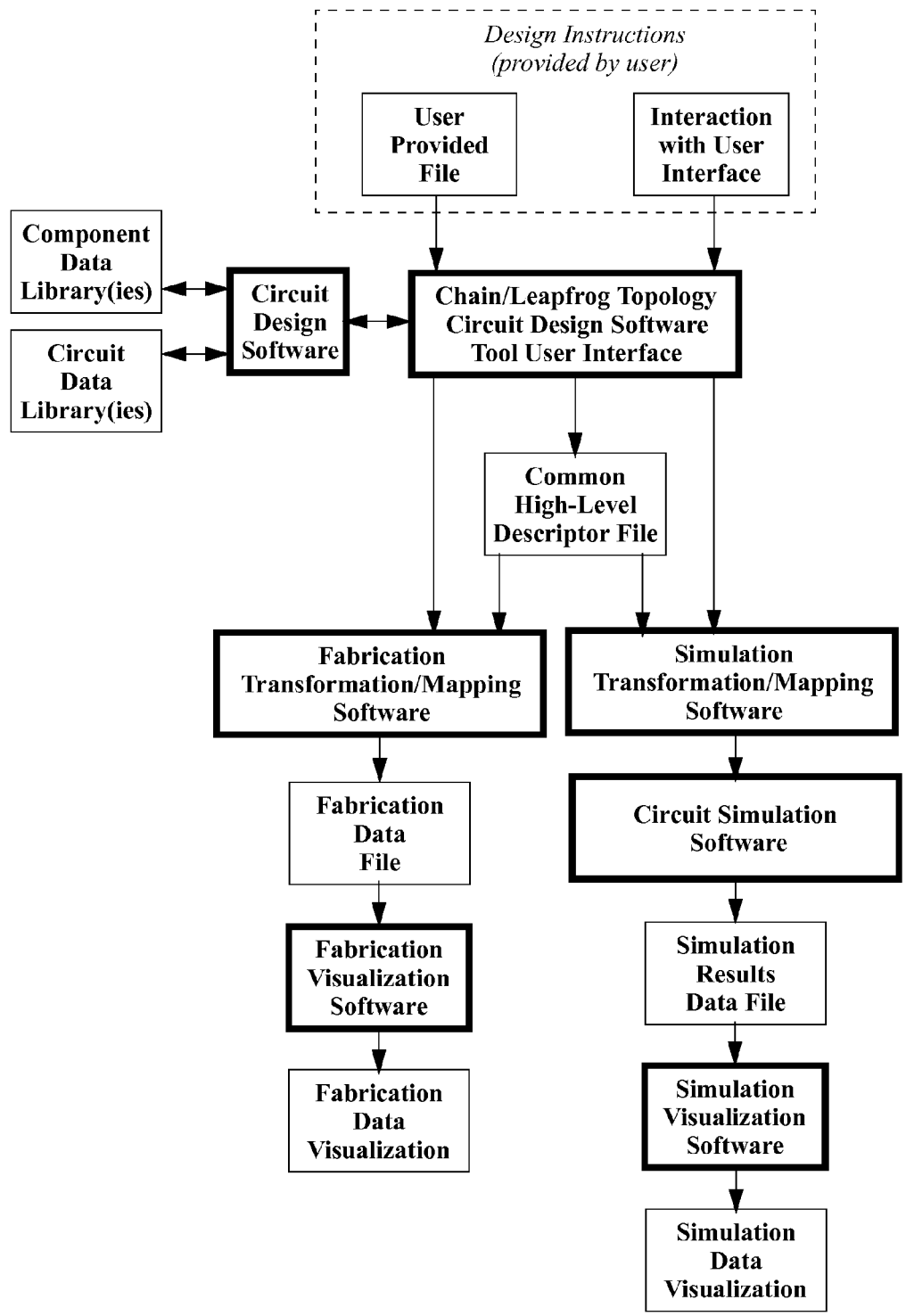

FIG. 29 depicts an exemplary combination of the exemplary embodiments depicted in FIGS. 23 and 27. In this figure, the boxes with thicker borders represent software while boxes with thinner borders depict data. In this exemplary embodiment the one or more selected fabrication method(s) or process(es) can be selected from the chain/leapfrog topology design software user interface.

Figure 30:
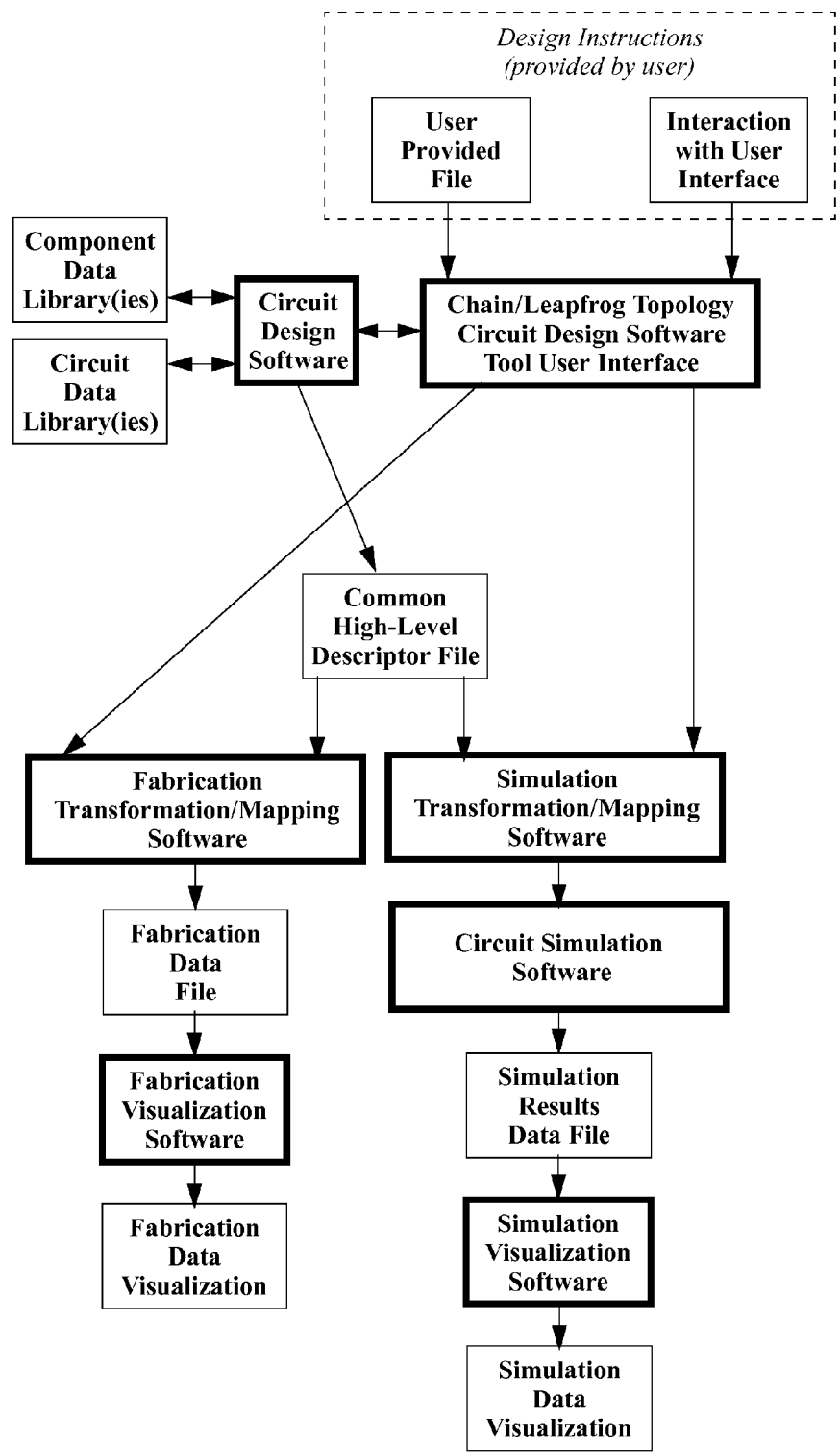

FIG. 30 depicts a slightly altered exemplary embodiment of the arrangement depicted in FIG. 29. In this exemplary embodiment the circuit design software retains the current design information and produces at least one common high-level descriptor file relevant to at least one type of nanoelectronics realization (carbon nanotubes, graphene ribbons, semiconducting polymer nanoelectronics, etc.). In this figure, the boxes with thicker borders represent software while boxes with thinner borders depict data. In this exemplary embodiment the one or more selected fabrication method(s) or process(es) can be selected from the chain/leapfrog topology design software user interface.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. Therefore, the invention properly is to be construed with reference to the claims.

I claim:

1. A method, comprising:
a computer system receiving design information specifying components of a circuit;
the computer system accessing a library that includes design information for nanoelectronic components corresponding to one or more of the specified components, wherein the nanoelectronic components have a topology in which a nanostructure is placed over a plurality of underlying structures connected in a chain, wherein a first underlying structure of the plurality of underlying structures leapfrogs at least a second underlying structure of the plurality of underlying structures; and
the computer system using the library to generate fabrication data usable to render the circuit using the corresponding nanoelectronic components.

2. The method of claim 1, wherein the nanostructure is a nanotube structure.

3. The method of claim 1, wherein the nanostructure is a nanoribbon structure.

4. The method of claim 1, further comprising:
the computer system receiving an input from a user selecting one of a plurality of fabrication processes;
based on the selected fabrication process, the computer system transforming a common high-level descriptor file into a fabrication data file including the fabrication data.

5. The method of claim 4, further comprising:
the computer system producing one or more visualizations of the fabrication data.

6. The method of claim 4, further comprising:
the computer system producing the common high-level descriptor file from design instructions received via a user interface.

7. The method of claim 1, wherein the fabrication data includes one or more images to be printed, one or more inks to print the one or more images, and an ordering in which the one or more images are to be printed.

8. The method of claim 1, further comprising:
the computer system simulating operation of the circuit using the corresponding nanoelectronic components.

9. The method of claim 1, wherein one of the nanoelectronic components is a differential amplifier.

10. The method of claim 9, wherein the differential amplifier includes a plurality of field effect transistors (FETs) and an interconnecting structure coupling a gate of a first FET to a gate of a second FET and a source of the second FET, wherein the interconnecting structure leapfrogs a drain of the second FET.

11. A method, comprising:
a computer system receiving design information specifying components of a circuit;
the computer system accessing design information for nanoelectronic components corresponding to one or more of the specified components, wherein the nanoelectronic components have a topology in which a nanostructure is placed over a plurality of underlying structures connected in a chain, wherein a first underlying structure of the plurality of underlying structures leapfrogs at least a second underlying structure of the plurality of underlying structures; and
the computer system using design information for one or more of the nanoelectronic components to simulate operation of the circuit.

12. The method of claim 11, further comprising:
the computer system producing one or more visualizations of results generated from simulating operation of the circuit.

13. The method of claim 11, further comprising:
selecting inks to create a prototype version of the circuit, wherein the prototype version has a larger scale than a corresponding version of the circuit that includes one or more of the nanoelectronic components, and wherein the selected inks have properties similar to properties of materials in the one or more nanoelectronic components.

14. The method of claim 11, wherein the using includes:
producing a common high-level descriptor file for the circuit; and
performing a simulation of the circuit from information specified in the common high-level descriptor file.

15. The method of claim 14, further comprising:
generating fabrication data for the circuit from information specified in the common high-level descriptor file.

16. The method of claim 11, wherein one of the nanoelectronic components is an amplifier that includes a plurality of field effect transistors (FETs), and wherein the amplifier includes a first interconnecting structure coupling a gate of a first FET to a gate of a second FET and a source of the second FET, wherein the first interconnecting structure leapfrogs a drain of the first FET.

17. The method of claim 16, wherein the amplifier further includes a second interconnecting structure coupling a gate of a third FET to a power supply terminal, wherein the second interconnecting structure leapfrogs a resistor structure.

18. A non-transitory computer readable medium having program instructions stored thereon that, when executed by a computing device, cause the computing device to perform operations comprising:
   accessing design information for nanoelectronic components having a chain/leapfrog topology in which a nanostructure is draped over a plurality of underlying structures connected in a chain, wherein a first underlying structure of the plurality of underlying structures leapfrogs at least a second underlying structure of the plurality of underlying structures; and
   generating fabrication data from the design information, wherein the fabrication data is usable to render a circuit including one or more of the nanoelectronic components.

19. The computer readable medium of claim 18, wherein the operations further comprise:
   generating simulation data from the design information, wherein the simulation data is usable to simulate operation of the circuit.

20. The computer readable medium of claim 18, wherein the operations further comprise:
   receiving, via a user interface, a selection of one of a plurality of fabrication processes, wherein the fabrication data and the simulation data are generated for the selected fabrication process.

21. The computer readable medium of claim 18, wherein the operations further comprise:
   selecting inks to create a prototype version of the circuit, wherein the prototype version emulates operation of a fabricated version of the circuit, and wherein the prototype version has a larger scale than the fabricated version.

22. The computer readable medium of claim 18, wherein one of the nanoelectronic components includes a plurality of field effect transistors (FETs) coupled terminal to terminal, and wherein the component includes an interconnecting structure coupling a terminal of a first FET to a terminal of a second FET, wherein the interconnecting structure leapfrogs one or more structures of a third FET.

23. The computer readable medium of claim 22, wherein the component is a differential amplifier, and wherein the interconnecting structure leapfrogs structures of the third FET and a fourth FET.

* * * * *